United States Patent
Anderson et al.

(10) Patent No.: US 9,805,935 B2
(45) Date of Patent: Oct. 31, 2017

(54) BOTTOM SOURCE/DRAIN SILICIDATION FOR VERTICAL FIELD-EFFECT TRANSISTOR (FET)

(71) Applicant: International Business Machines Corporation, Armonk, NY (US)

(72) Inventors: Brent A. Anderson, Jericho, VT (US); Huiming Bu, Glenmont, NY (US); Terence B. Hook, Jericho, VT (US); Fee Li Lie, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 14/985,943

(22) Filed: Dec. 31, 2015

(65) Prior Publication Data

US 2017/0194155 A1    Jul. 6, 2017

(51) Int. Cl.
| | |
|---|---|
| *H01L 29/78* | (2006.01) |
| *H01L 21/336* | (2006.01) |
| *H01L 21/285* | (2006.01) |
| *H01L 29/66* | (2006.01) |
| *H01L 29/417* | (2006.01) |

(Continued)

(52) U.S. Cl.
CPC ...... *H01L 21/28518* (2013.01); *H01L 23/535* (2013.01); *H01L 29/0649* (2013.01); *H01L 29/41791* (2013.01); *H01L 29/66553* (2013.01); *H01L 29/66795* (2013.01); *H01L 29/785* (2013.01)

(58) Field of Classification Search
CPC .............. H01L 21/28518; H01L 23/535; H01L 29/0649; H01L 29/41791; H01L 29/665553; H01L 29/66795; H01L 29/785; H01L 29/66803
See application file for complete search history.

(56) References Cited

U.S. PATENT DOCUMENTS

| | | |
|---|---|---|
| 5,128,272 A | 7/1992 | Ramde |
| 5,326,711 A | 7/1994 | Malhi |

(Continued)

FOREIGN PATENT DOCUMENTS

| | | |
|---|---|---|
| CA | 1271266 A | 7/1990 |
| WO | 02086904 A2 | 10/2002 |

(Continued)

*Primary Examiner* — Mary Wilczewski
*Assistant Examiner* — Tsz Chiu
(74) *Attorney, Agent, or Firm* — Vazken Alexanian; Ryan, Mason & Lewis, LLP

(57) ABSTRACT

A method for manufacturing a semiconductor device includes forming a first active region on a semiconductor substrate, forming a semiconductor layer on the first active region, patterning the semiconductor layer into a plurality of fins extending from the first active region vertically with respect to the semiconductor substrate, wherein the first active region is located at bottom ends of the plurality of fins, forming a silicide layer on exposed portions of the first active region, forming an electrically conductive contact on the silicide region, forming a second active region on top ends of each of the plurality of fins, and forming a gate structure between the plurality of fins, wherein the gate structure is positioned over the first active region and under the second active region.

18 Claims, 27 Drawing Sheets

(51) Int. Cl.
*H01L 23/535* (2006.01)
*H01L 29/06* (2006.01)

(56) References Cited

U.S. PATENT DOCUMENTS

| | | | |
|---|---|---|---|
| 5,382,540 A * | 1/1995 | Sharma | H01L 27/11556 257/E21.693 |
| 6,104,061 A | 8/2000 | Forbes et al. | |
| 6,150,210 A | 11/2000 | Arnold | |
| 6,194,773 B1 | 2/2001 | Malhi | |
| 7,560,728 B2 | 7/2009 | Lin et al. | |
| 7,586,149 B2 | 9/2009 | Yoon et al. | |
| 7,791,068 B2 | 9/2010 | Meng et al. | |
| 8,207,032 B2 | 6/2012 | Fischer et al. | |
| 8,383,477 B2 | 2/2013 | Lee | |
| 8,409,948 B2 | 4/2013 | Fischer et al. | |
| 8,471,310 B2 | 6/2013 | Hynecek | |
| 8,637,930 B2 * | 1/2014 | Ando | H01L 29/785 257/347 |
| 8,673,722 B2 | 3/2014 | Huang et al. | |
| 8,796,784 B2 | 8/2014 | Ando et al. | |
| 9,048,329 B2 | 6/2015 | Kim et al. | |
| 2003/0015755 A1 | 1/2003 | Hagemeyer | |
| 2005/0040444 A1 * | 2/2005 | Cohen | H01L 21/82341 257/288 |
| 2006/0088967 A1 * | 4/2006 | Hsiao | H01L 29/66795 438/296 |
| 2007/0120156 A1 * | 5/2007 | Liu | H01L 27/0207 257/288 |
| 2007/0141763 A1 * | 6/2007 | Choi | H01L 29/66795 438/151 |
| 2007/0190708 A1 * | 8/2007 | Kaneko | H01L 21/845 438/157 |
| 2008/0197397 A1 | 8/2008 | Parthasarathy et al. | |
| 2011/0006360 A1 | 1/2011 | Ikebuchi | |
| 2012/0214285 A1 | 8/2012 | Guha et al. | |
| 2013/0193400 A1 | 8/2013 | Sandhu et al. | |
| 2013/0334614 A1 * | 12/2013 | Liaw | H01L 21/82382 257/401 |
| 2014/0015055 A1 | 1/2014 | Flachowsky et al. | |
| 2014/0110767 A1 * | 4/2014 | Anderson | H01L 27/0924 257/288 |
| 2015/0129831 A1 | 5/2015 | Colinge et al. | |
| 2015/0200308 A1 | 7/2015 | Karda et al. | |

FOREIGN PATENT DOCUMENTS

| | | |
|---|---|---|
| WO | 2005091376 A1 | 9/2005 |
| WO | 2013123287 A1 | 8/2013 |

* cited by examiner

BOTTOM SOURCE/DRAIN SILICIDATION FOR VERTICAL FIELD-EFFECT TRANSISTOR (FET)

TECHNICAL FIELD

The field generally relates to semiconductor devices and methods of manufacturing same and, in particular, to an integration method and structure including a silicide connection for a bottom source/drain of a field-effect transistor (FET).

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into a fin-like shape and functions as the channel of the transistor.

Known FinFET devices include fins with source/drain regions on lateral sides of the fins, so that current flows in a horizontal direction (e.g., parallel to a substrate) between source/drain regions at opposite ends of the fins in the horizontal direction. The known structures have their architectures limited by scaling plateaus. For example, known horizontal devices can have contacted poly pitch (CPP) plateaus between 30 nm and 50 nm, and are driven by such competing considerations as electrostatics, contact resistance ($R_{contact}$), and maximum voltage ($V_{max}$).

SUMMARY

According to an exemplary embodiment of the present invention, a method for manufacturing a semiconductor device includes forming a source/drain region on a semiconductor substrate, forming a semiconductor layer on the source/drain region, patterning the semiconductor layer into a plurality of fins extending from the source/drain region vertically with respect to the semiconductor substrate, wherein the source/drain region is located at bottom ends of the plurality of fins, forming a silicide layer on exposed portions of the source/drain region, and forming an electrically conductive contact on the silicide region.

According to an exemplary embodiment of the present invention, a semiconductor device includes a substrate, a source/drain region on the substrate, a plurality of fins extending from the source/drain region vertically with respect to the substrate, wherein the source/drain region is located at bottom ends of the plurality of fins, a silicide layer on exposed portions of the source/drain region, and an electrically conductive contact on the silicide region.

According to an exemplary embodiment of the present invention, a method for manufacturing a semiconductor device includes forming a first active region on a semiconductor substrate, forming a semiconductor layer on the first active region, patterning the semiconductor layer into a plurality of fins extending from the first active region vertically with respect to the semiconductor substrate, wherein the first active region is located at bottom ends of the plurality of fins, forming a silicide layer on exposed portions of the first active region, forming an electrically conductive contact on the silicide region, forming a second active region on top ends of each of the plurality of fins, and forming a gate structure between the plurality of fins, wherein the gate structure is positioned over the first active region and under the second active region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
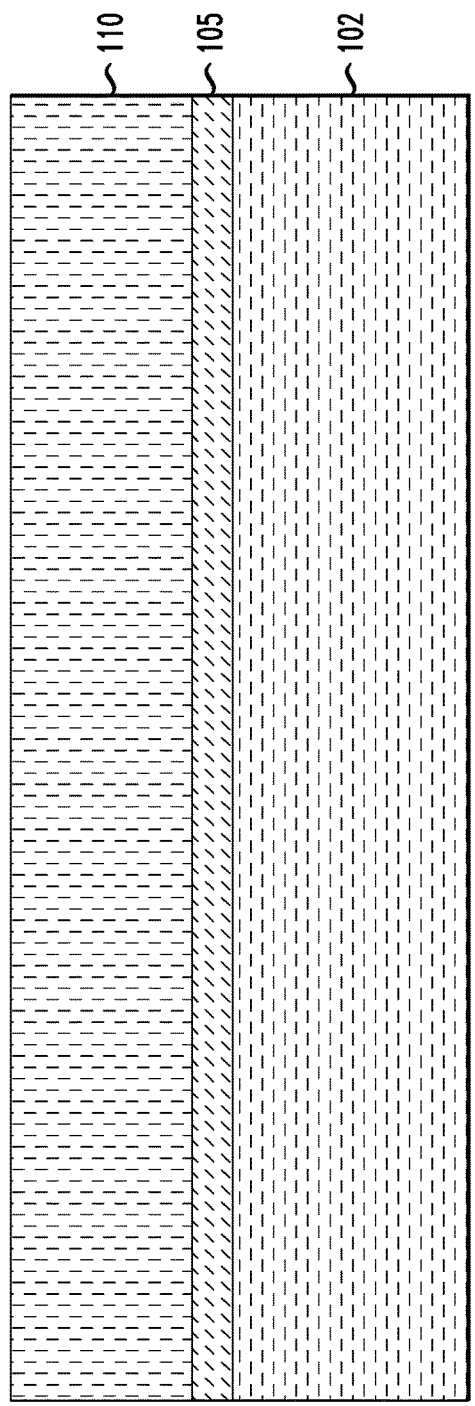
FIG. 1 is a cross-sectional view illustrating formation of doped and non-doped semiconductor layers in a method for manufacturing a semiconductor device, according to an exemplary embodiment of the present invention.

Exemplary embodiments of the invention will now be discussed in further detail with regard to semiconductor devices and methods of manufacturing same and, in particular, to an integration method and structure including a silicide connection for a bottom source/drain of a field-effect transistor (FET).

Embodiments of the present invention relate to vertical transport architecture FET devices including source/drain regions at ends of the fins on top and bottom sides of the fins so that current runs through the fins in a vertical direction (e.g., perpendicular to a substrate) from a bottom source/drain region to a top source/drain region. Vertical transport architecture devices are designed to extend the product value proposition beyond conventional plateaus and address the limitations of horizontal device architectures by, for example, decoupling electrostatics and FET $V_{max}$ from CPP, providing a FinFET-equivalent density at a larger CPP, by removing the Lgate as a pressure point.

Embodiments of the present invention provide a low resistance connection to an active (RX) area, which functions as a bottom source/drain region of the vertically conducting fins. Embodiments of the present invention reduce the resistance of the doped source/drain region by siliciding this region using, for example, cobalt silicide ($CoSi_x$) or tungsten silicide ($WSi_x$), which have high thermal stability. According to an embodiment, the silicide layer is encapsulated by a bottom spacer layer to protect the channel region from the silicide.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "vertical" refers to a direction perpendicular to a substrate in the cross-sectional and three-dimensional views herein. Current between source/drain regions is described herein as flowing in a vertical direction (e.g., from a bottom source/drain region to a top source/drain region) through a fin channel region.

As used herein, "horizontal" refers to a direction parallel to a substrate in the cross-sectional and three-dimensional views herein.

As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate 102 to a top surface of the element. A thickness of an element can be equal to a height of the element if the element is directly on the substrate.

As used herein, "lateral," "lateral side," "lateral surface" refers to a side surface of an element (e.g., a layer, opening, etc.), such as a left or right side surface in the cross-sectional views herein.

FIG. 1 is a cross-sectional view illustrating formation of doped and non-doped semiconductor layers in a method for manufacturing a semiconductor device, according to an exemplary embodiment of the present invention.

A fin of a FinFET can include, for example, silicon, and is a conducting channel that protrudes vertically from a substrate and conducts in a direction from a source to a drain. As can be understood by one of ordinary skill in the art, a plurality of fins can be formed on the substrate 102 and spaced apart from each other at regular intervals. A plurality of gates can intersect the fins.

Referring to FIG. 1, a semiconductor substrate 102 can be, for example, a bulk substrate including semiconductor material including, but not limited to, silicon (Si), silicon germanium (SiGe), strain-relaxed buffer (SRB) SiGe, silicon carbide (SiC), silicon-germanium-carbon (SiGeC) or other like semiconductor. In addition, multiple layers of the semiconductor materials can be used as the semiconductor material of the substrate.

In accordance with an embodiment of the present invention, as can be seen in FIG. 1, a n+ or p+ doped semiconductor layer 105 of and a non-doped semiconductor layer 110 are epitaxially grown. The doped semiconductor layer 105 can include, but is not limited to, Si, SiGe or SiC. The non-doped semiconductor layer 110, also referred to herein as a channel layer, can include, but is not limited to, Si, SiGe or III-V materials. For purposes of explanation, the semiconductor layer 110 may be referred to as a silicon layer.

Doping of the semiconductor layer 105 can be performed using, for example, ion implantation, or annealing if not using an epitaxial process. In a non-limiting illustrative example, the doping of the layer 105 uses, for example, arsenic (As) or phosphorous (P) for n-type device (e.g., nFET), and boron (B) for a p-type device (e.g., pFET), at concentrations in the general range of e20/cm$^3$.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 2:
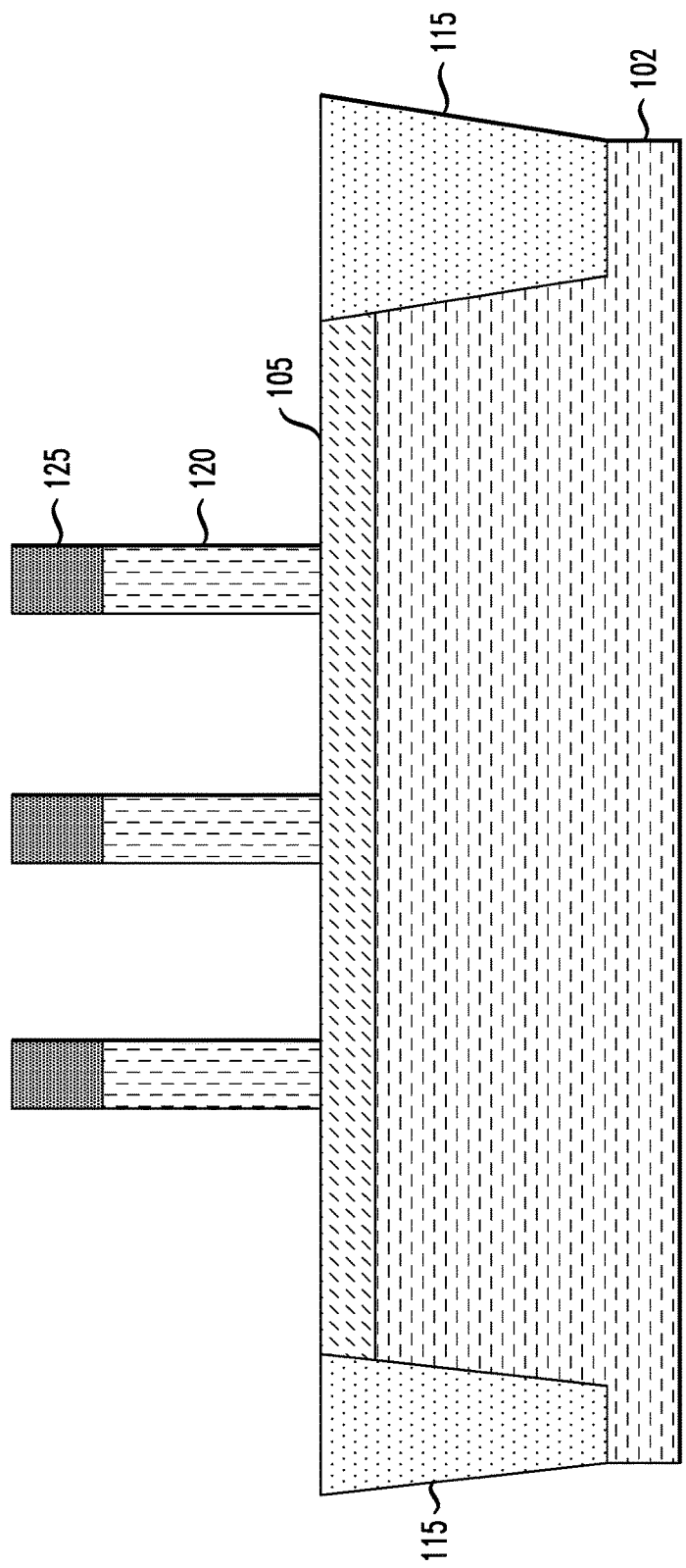
FIG. 2 is a cross-sectional view illustrating fin and isolation region formation in a method for manufacturing a semiconductor device, according to an exemplary embodiment of the present invention.

FIG. 2 is a cross-sectional view illustrating fin and isolation region formation in a method for manufacturing a semiconductor device, according to an exemplary embodiment of the present invention. Fins, such as fin 120, can be formed by patterning the semiconductor layer 110 into the fins 110. A hardmask 125 including, for example, a dielectric material, such as silicon nitride (SiN) is formed on portions that are to be formed into the fins 120. The fin patterning can be done by a spacer image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (ME) processes. As a result, the spacers will have half the pitch of the mandrel. In other words, the pattern is transferred from a lithography defined mandrel to spacers, where the pattern density is doubled. The spacer pattern can be used as the hardmask 125 to form the fins 120 by RIE processes. According to an embodiment, the fins can be patterned to height to about 20 nm to about 50 nm.

FIG. 2 also illustrates formation of isolation regions 115 in a method for manufacturing a semiconductor device, according to an exemplary embodiment of the present invention. Portions of the substrate 102 and doped semiconductor layer 105 are etched to form trenches in the layers 102 and 105, in which a dielectric material, including, but not limited to silicon dioxide ($SiO_2$), low-temperature oxide (LTO), high-temperature oxide (HTO), flowable oxide (FOX) or some other dielectric, is deposited to form isolation regions 115, such as, for example, shallow trench isolation (STI) regions. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating, followed by a planarization process, such as, chemical mechanical planarization (CMP) to remove excess isolation material.

Figure 3:
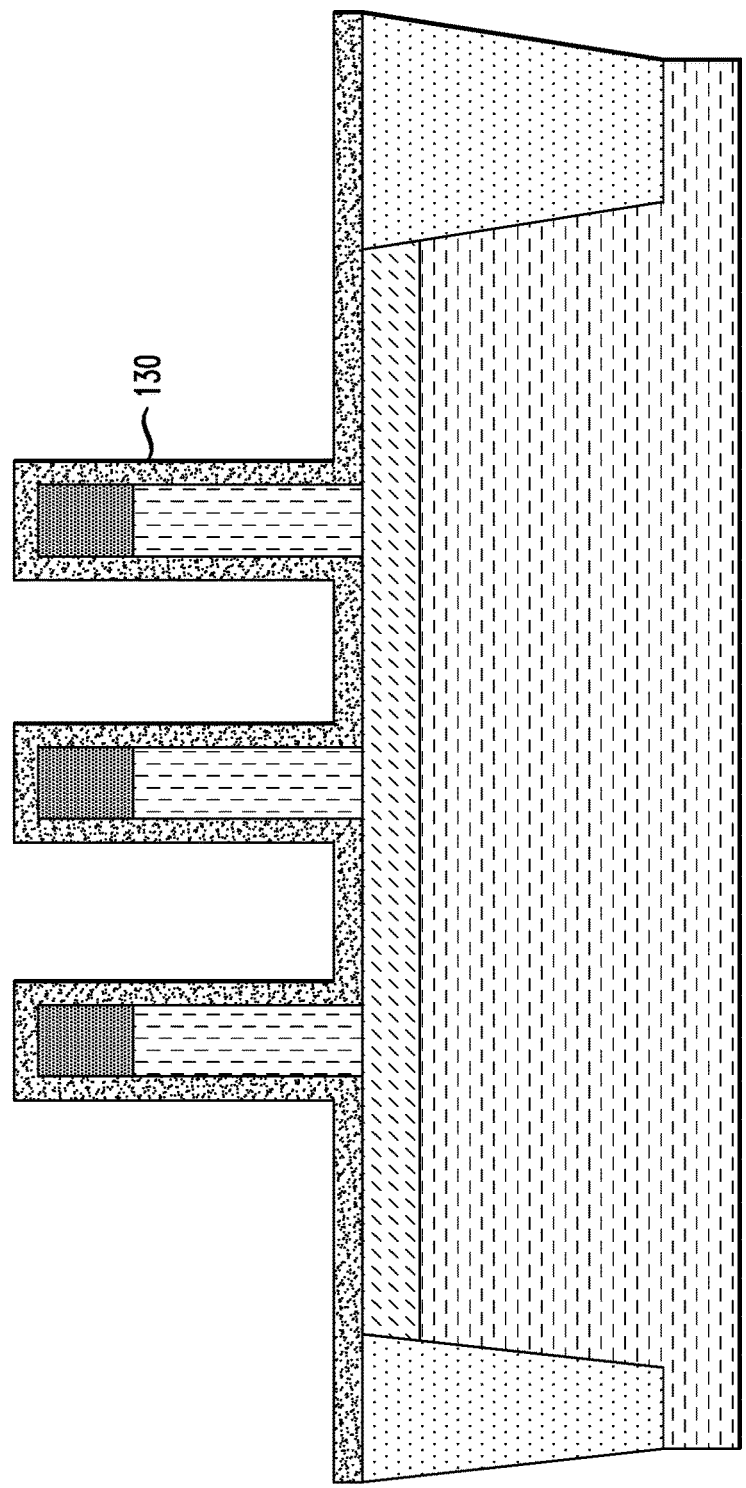
FIG. 3 is a cross-sectional view illustrating deposition of a protective conformal layer 130 in a method for manufacturing a semiconductor device, according to an exemplary embodiment of the present invention.

FIG. 3 is a cross-sectional view illustrating deposition of a protective conformal layer 130 in a method for manufacturing a semiconductor device, according to an exemplary embodiment of the present invention. As shown in FIG. 3, a conformal deposition process, such as, for example, ALD or MLD can be used to deposit conformal layer 130 on the isolation regions 115 and the semiconductor layer 105, and on and around the fins 120 including the hardmasks 125 thereon. The layer 130 can include, but is not limited to, siliconborocarbonitride (SiBCN), silicon oxycarbonitride (SiOCN), SiN or $SiO_2$.

Figure 4:
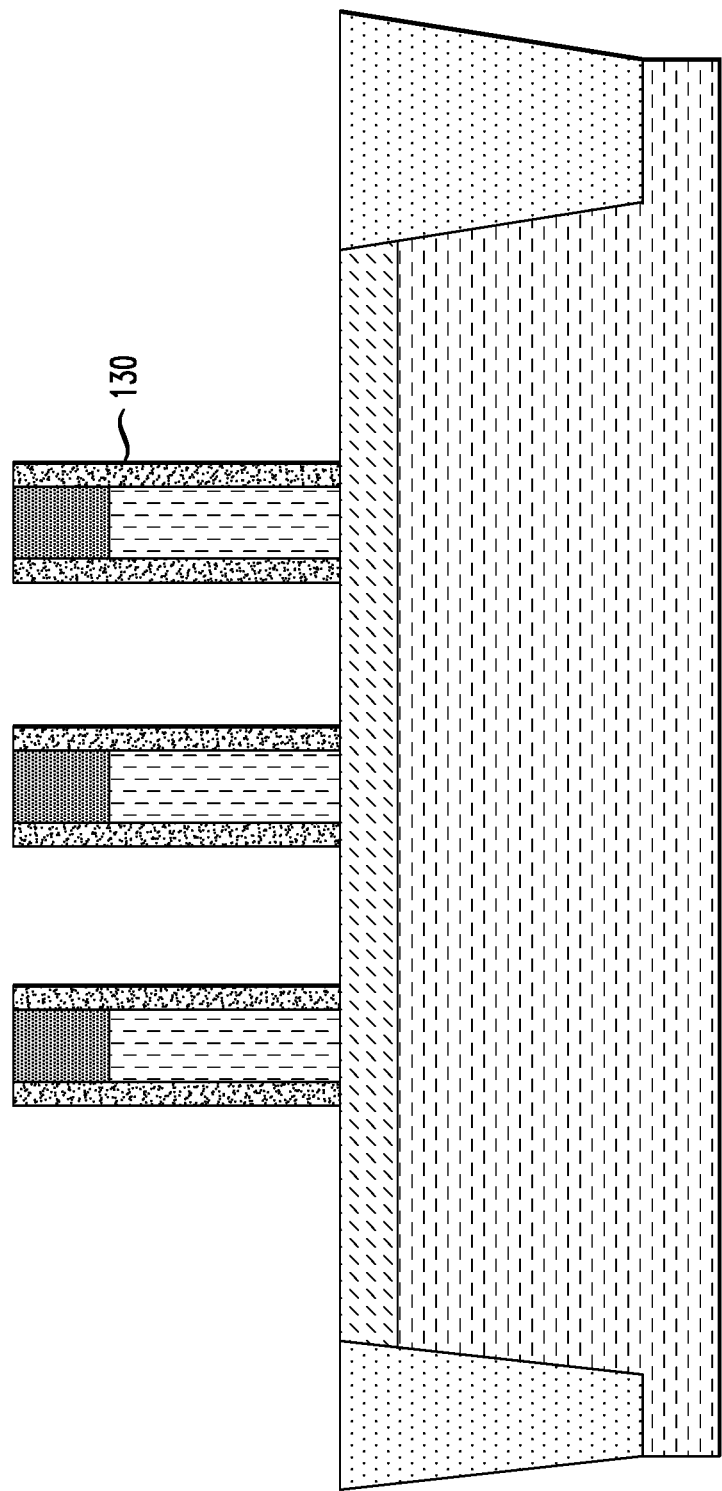
FIG. 4 is a cross-sectional view illustrating removal of a portion of the protective conformal layer in a method for manufacturing a semiconductor device, according to an exemplary embodiment of the present invention.

FIG. 4 is a cross-sectional view illustrating removal of a portion of the protective conformal layer 130 in a method for manufacturing a semiconductor device, according to an exemplary embodiment of the present invention. As shown in FIG. 4, the horizontal portions of the layer 130 on the isolation regions 115, the semiconductor layer 105, and on top of hardmasks 125, are etched back to form spacer-like shapes to protect the fins 120 during metal silicidation. The etch can be, for example, an anisotropic etch, such as RIE, ion beam etching, plasma etching or laser ablation.

Figure 5:
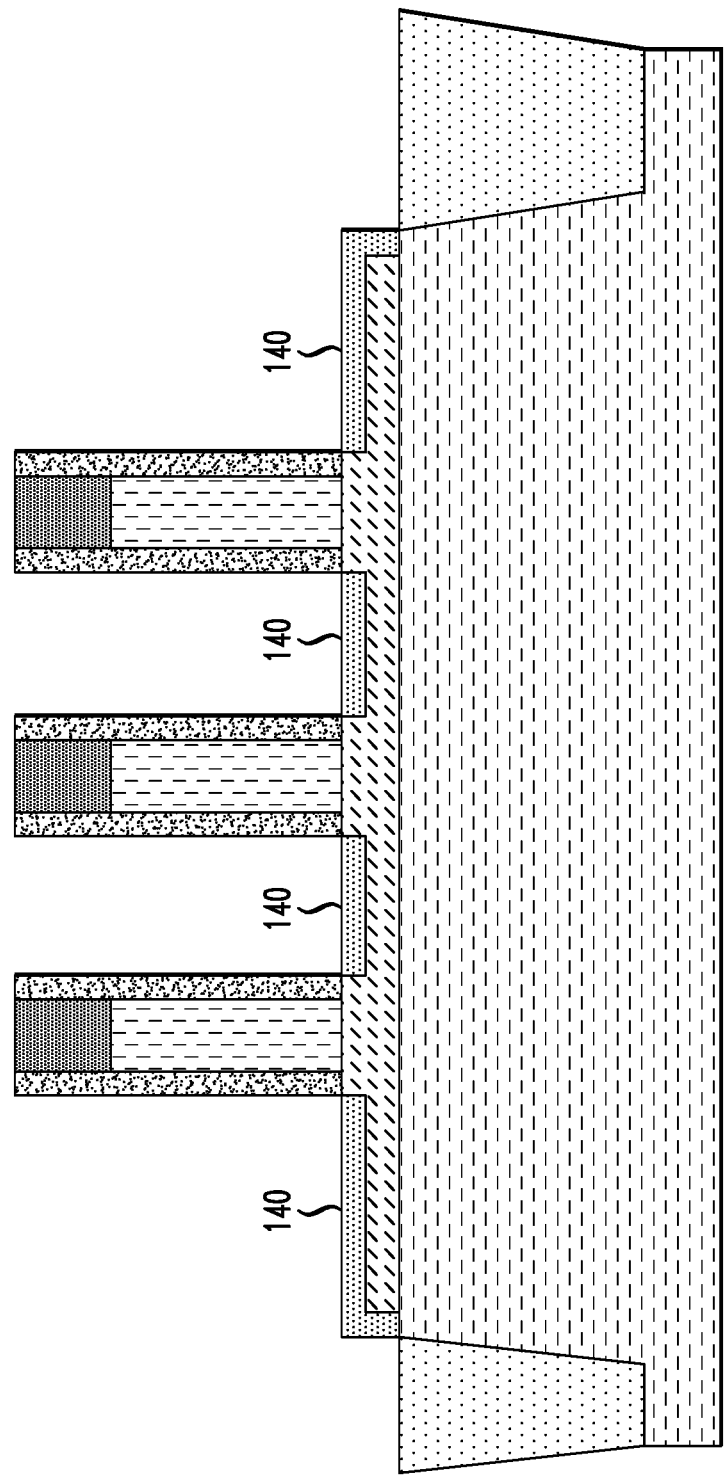
FIG. 5 is a cross-sectional view illustrating silicidation of a doped semiconductor layer in a method for manufacturing a semiconductor device, according to an exemplary embodiment of the present invention.

FIG. 5 is a cross-sectional view illustrating silicidation of the active surface (i.e., doped semiconductor layer 105) in a method for manufacturing a semiconductor device, according to an exemplary embodiment of the present invention. As shown in FIG. 5, according to an embodiment, the isolation regions are first recessed to a level below the layer 105, using, for example, an etching process, so that ends of the layer are exposed and can be covered with a deposited metal layer. Then, a metal layer including a material capable of forming a silicide is deposited on the layer 105 and the isolation regions 115. The material can include, but is not limited to, metals such as cobalt and tungsten, or combinations thereof. The material preferably is thermally stable, being able to remain stable under high temperatures due to subsequent steps performed under high temperature conditions. The metal layer can be deposited using deposition techniques including, but not limited to, CVD, PECVD, RFCVD, PVD, ALD, MLD, MBD, PLD, and/or LSMCD, sputtering, and/or plating.

Then, a process, such as, for example, an annealing process at approximately 300° C. to approximately 700°, is performed so that the metal layer reacts with silicon in the layer 105 to convert a portion of the layer 105 into a silicide layer 140. The annealing process is not necessarily limited to the temperature range above, and may be performed at other temperatures if required. The silicide layer 140 may include, but is not limited to, cobalt silicide ($CoSi_x$), tungsten silicide ($WSi_x$) and combinations thereof. As shown in FIG. 5, due to the reaction with the layer 105, portions of the layer 105 are replaced by the silicide layer 140. As can be seen, portions of the silicide layer 140 wrap around left and right edges of the layer 105 to form an L-shape where the isolation regions 115 were recessed, and the metal layer was able to react with the edges of the layer 105. The wrapping of the edges of layer 105 by the silicide layer 140 further lowers resistance for the resulting bottom source/drain region.

The part of the metal layer formed on the isolation regions 115 prior to the annealing step is removed by, for example, an etching process, such as a wet etch, since those parts of the metal layer 140 do not react with the isolation regions 115, and are not converted to a silicide during the annealing process.

Figure 6:
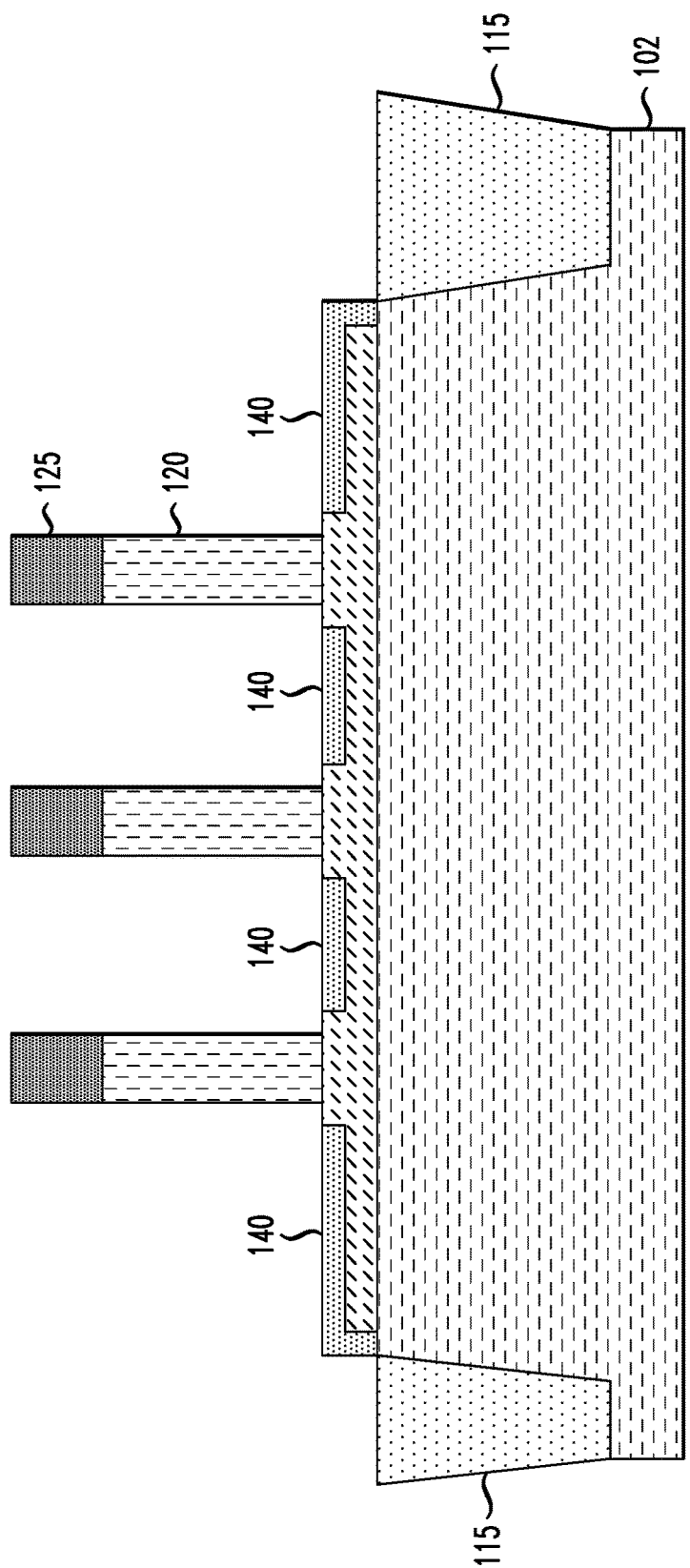
FIG. 6 is a cross-sectional view illustrating stripping of the protective layer in a method for manufacturing a semiconductor device, according to an exemplary embodiment of the present invention.

FIG. 6 is a cross-sectional view illustrating stripping of the protective layer in a method for manufacturing a semiconductor device, according to an exemplary embodiment of the present invention. As shown in FIG. 6, after silicidation, the protective layer 130 is stripped from the sides of the fins 120 and hardmasks 125 stacked on the fins 120. The stripping can be performed using, for example, an $H_4PO_3$ solution for SiN, a hydrofluoric acid (HF) solution or $NH_4/F$ based dry etching for $SiO_2$ and an isotropic dry etching process for SiBCN.

Figure 7:
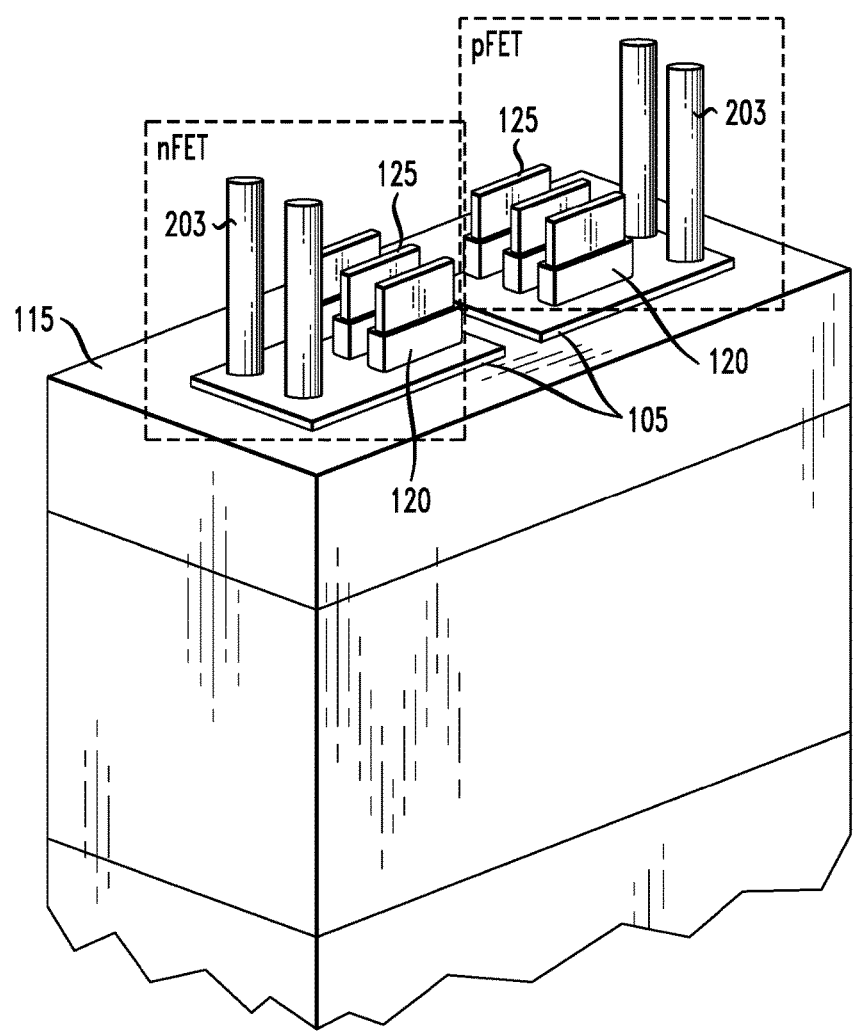
FIG. 7 is a three-dimensional view of a semiconductor device illustrating an arrangement of fins including hardmasks stacked thereon, and a bottom source/drain region, according to an exemplary embodiment of the present invention.

FIG. 7 is a three-dimensional view of a semiconductor device illustrating an arrangement of fins including hardmasks stacked thereon, and a bottom source/drain region, according to an exemplary embodiment of the present invention. Referring to FIG. 7, the fins 120 including hardmasks 125 stacked thereon can form an nFET or a pFET depending on doping of the bottom source/drain region (e.g., semiconductor layer 105). As can be seen, as described further herein, contacts 203 (see FIG. 27) conduct electrical current to the bottom source/drain regions so that current can flow upward vertically through the fins 120 to top source/drain regions (not shown). Although not shown in FIG. 7, the bottom source/drain regions 105 include the silicide layers 140 to reduce the resistance of the bottom source/drain regions. FIG. 7 further illustrates the isolation regions 115.

Figure 8:
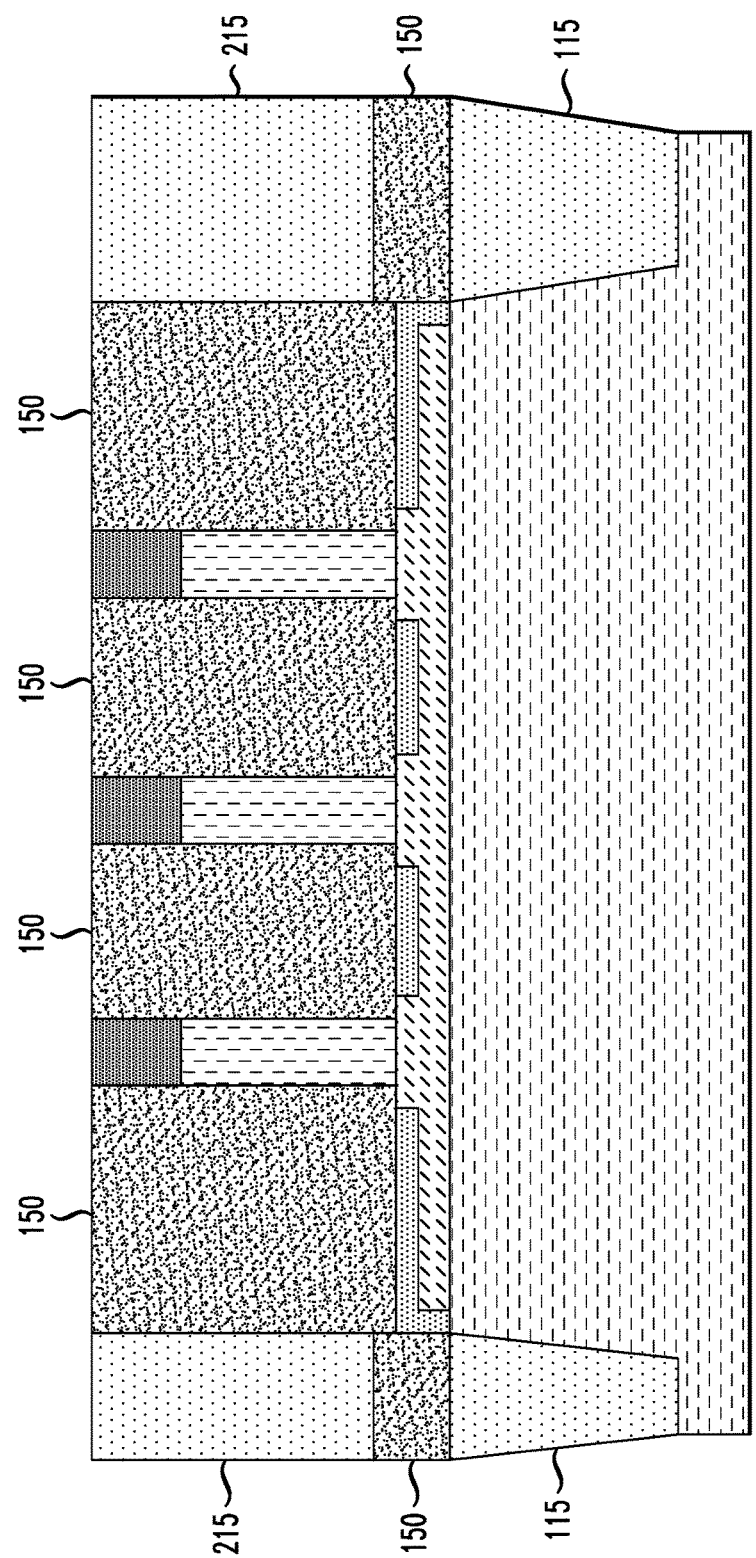
FIG. 8 is a cross-sectional view illustrating deposition of dielectric layers in a method for manufacturing a semiconductor device, according to an exemplary embodiment of the present invention.
Figure 9:
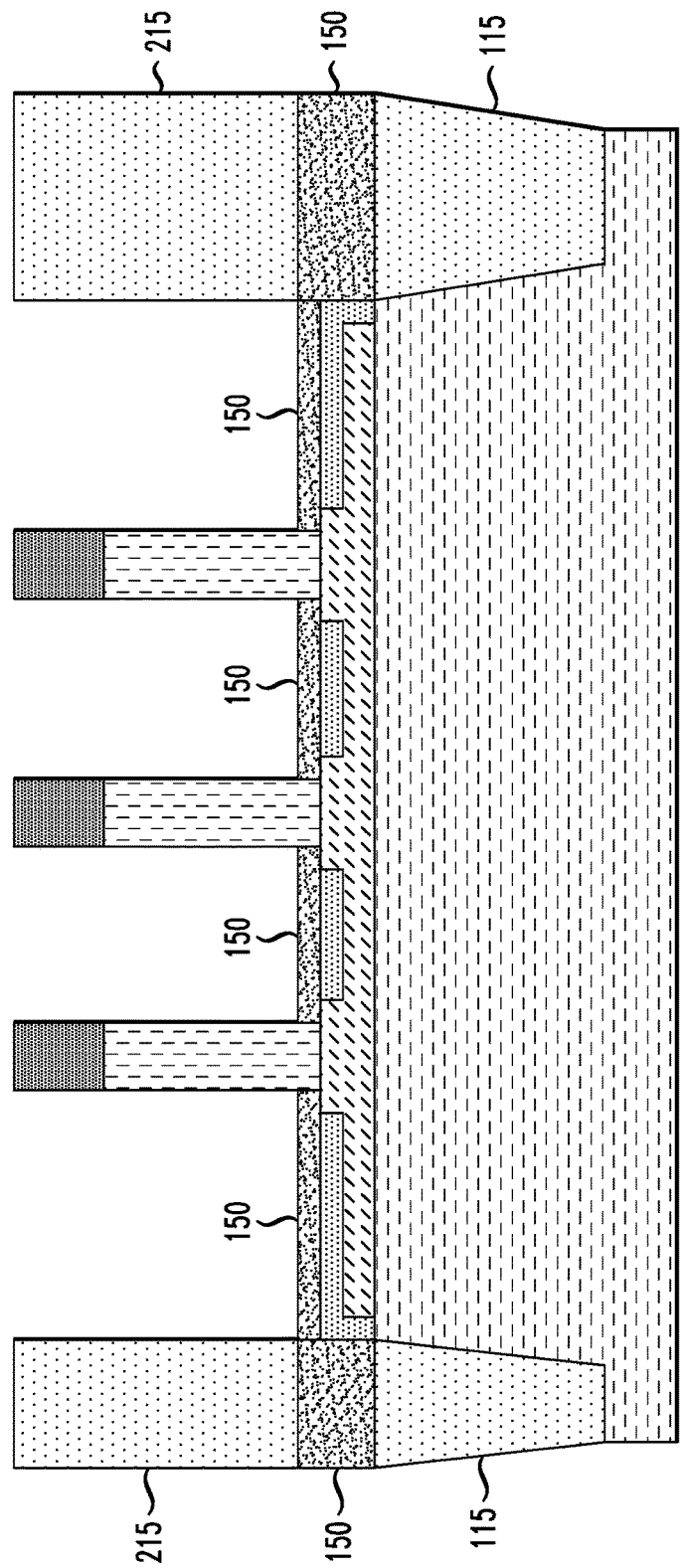
FIG. 9 is a cross-sectional view illustrating removal of portions of spacer dielectric layers in a method for manufacturing a semiconductor device, according to an exemplary embodiment of the present invention.
Figure 10:
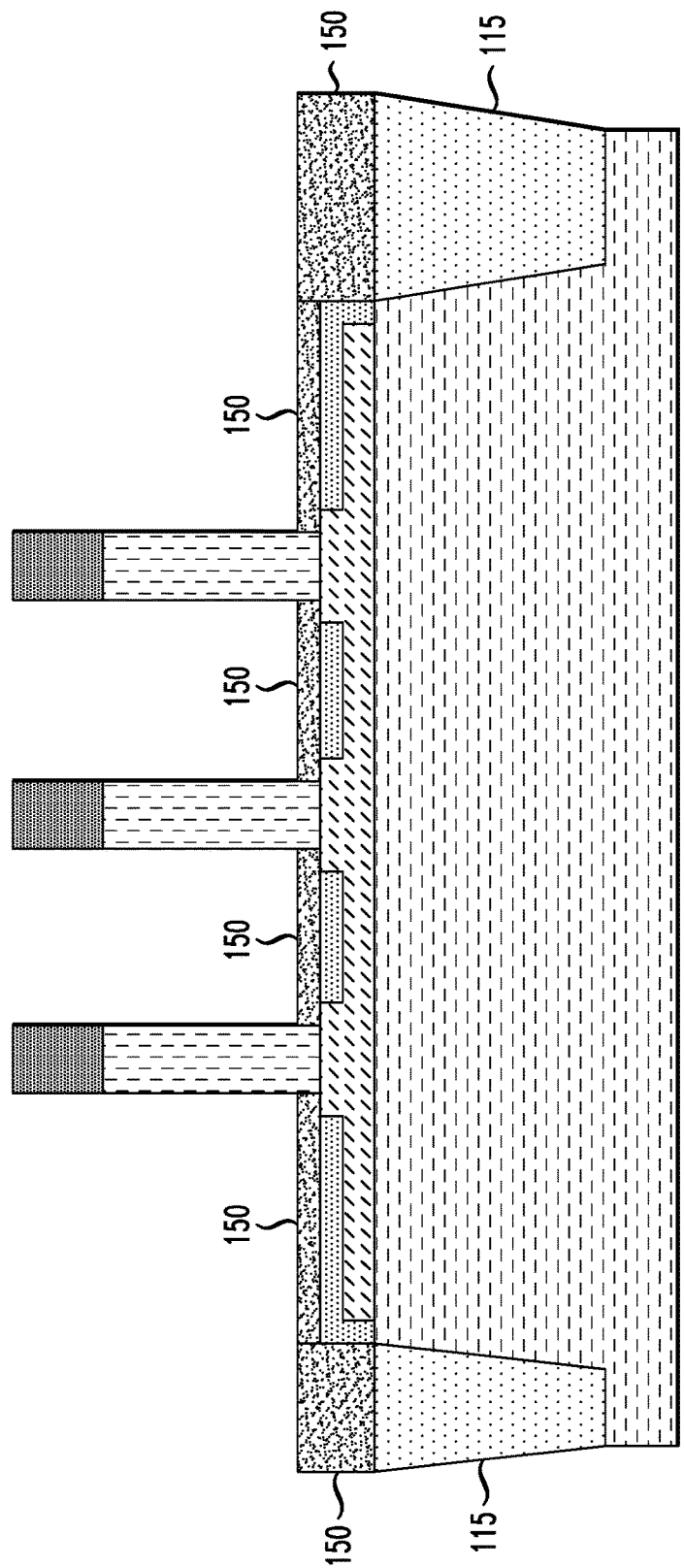
FIG. 10 is a cross-sectional view illustrating removal of interlayer dielectric layers in a method for manufacturing a semiconductor device, according to an exemplary embodiment of the present invention.
Figure 11:
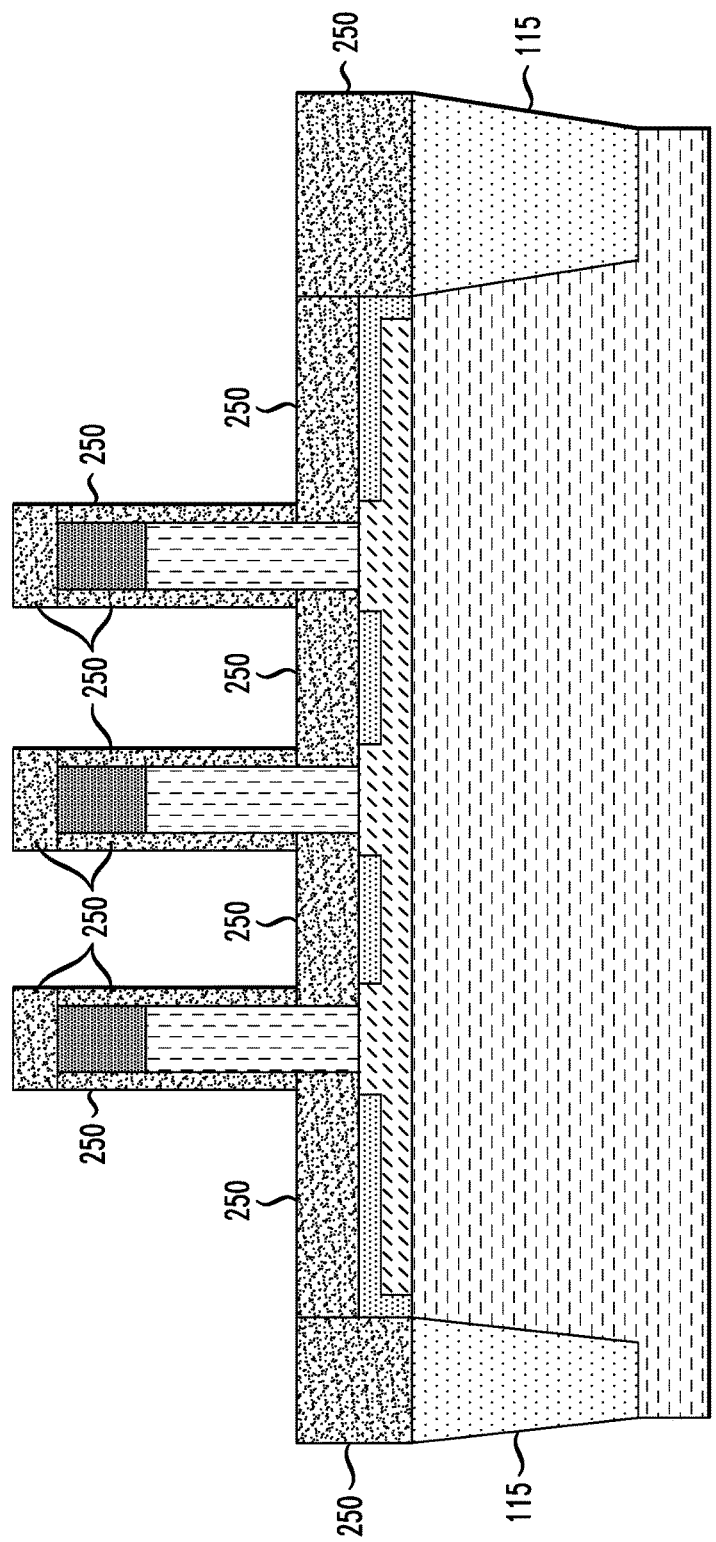
FIG. 11 is a cross-sectional view illustrating deposition of dielectric layers in a method for manufacturing a semiconductor device, according to an exemplary embodiment of the present invention.
Figure 12:
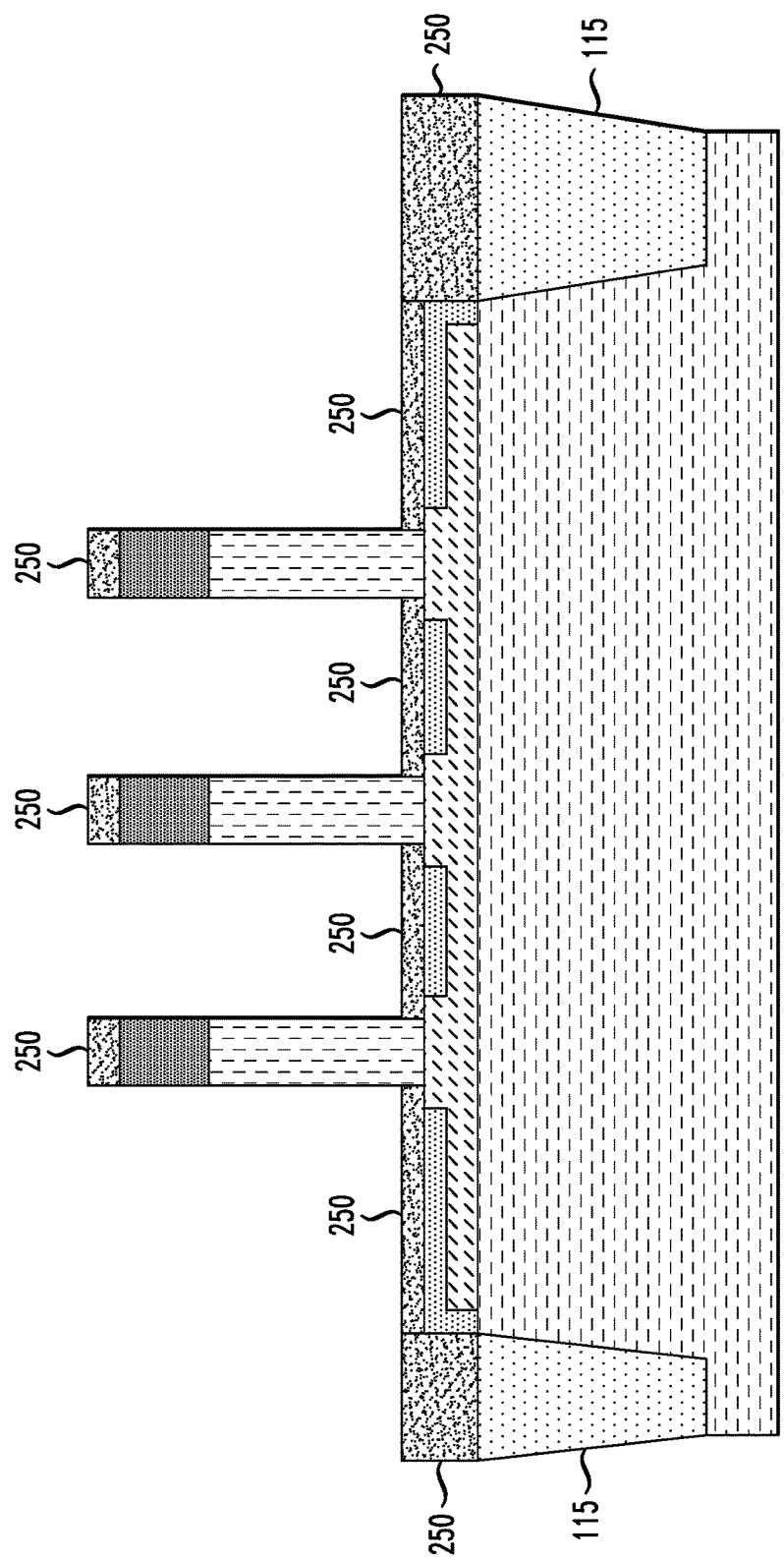
FIG. 12 is a cross-sectional view illustrating removal of portions of spacer dielectric layers in a method for manufacturing a semiconductor device, according to an exemplary embodiment of the present invention.

The following description in connection with FIGS. 8-10 illustrates a process flow for forming spacer layers, according to an exemplary embodiment of the present invention, while FIGS. 11-12 illustrate an alternative process flow for forming spacer layers, according to an exemplary embodiment of the present invention.

Following from FIG. 6, FIG. 8 is a cross-sectional view illustrating deposition of dielectric layers in a method for manufacturing a semiconductor device, according to an exemplary embodiment of the present invention. As shown in FIG. 8, spacer dielectric layers 150, such as, for example a PECVD-type, high aspect ratio process (HARP)-type or high density plasma (HDP)-type low-K dielectric layers, including, but not limited to, SiBCN, SiOCN, SiN or $SiO_2$, are deposited using, for example, PECVD, HARP or HDP techniques, on the isolation regions 115, silicide layers 140, layer 105 and on the stacked structures including the fins 120 and the hardmasks 125. In addition, a dielectric material, including, but not limited to silicon dioxide ($SiO_2$), low-temperature oxide (LTO), high-temperature oxide (HTO), field oxide (FOX) or some other dielectric, is deposited to form interlayer dielectric layers 215. The interlayer dielectric layers 215 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 150 and 215 and planarize the resulting structure.

FIG. 9 is a cross-sectional view illustrating removal of portions of spacer dielectric layers in a method for manufacturing a semiconductor device, according to an exemplary embodiment of the present invention. As shown in FIG. 9, portions of the spacer dielectric layers 150 are removed by, for example, an etchback process, to bring the spacer layers 150 down to correspond to lower portions of the fins 120 and lower surfaces of the interlayer dielectric layers 215. Then, as shown in FIG. 10, the interlayer dielectric layers 215 are removed using, for example, a selective etching process. The spacer layers 150 cover the top and side portions of the silicide layer 140 so that the silicide layer 140 is encapsulated by the spacer layers 150.

In an alternative process for forming spacer layers following from FIG. 6, FIG. 11 is a cross-sectional view illustrating deposition of dielectric layers in a method for manufacturing a semiconductor device, according to an exemplary embodiment of the present invention. As shown in FIG. 11, spacer dielectric layers 250, such as, for example a PECVD-type, HARP-type or HDP-type low-K dielectric layers, including, but not limited to, SiBCN, SiOCN, SiN or $SiO_2$, are deposited using, for example, PECVD, HARP or HDP techniques, on the isolation regions 115, silicide layers 140, layer 105 and on the stacked structures including the fins 120 and the hardmasks 125. As can be seen in FIG. 11, the dielectric layers 250 are deposited to be thicker on horizontal portions (e.g., on the isolation regions 115, silicide layers 140, layer 105, and on the top surfaces of the hardmasks 125) than on the vertical side portions of the stacked structures including the fins 120 and the hardmasks 125.

Then, referring to FIG. 12, an anisotropic etching process, such as ME, ion beam etching, plasma etching or laser ablation is performed to completely remove the dielectric layers 250 from the vertical side portions of the stacked structures including the fins 120 and the hardmasks 125, while leaving part or all of the dielectric layers on the horizontal portions. The spacer layers 250 cover the top and side portions of the silicide layer 140 so that the silicide layer 140 is encapsulated by the spacer layers 250.

The following FIGS. 13-27 flow from FIG. 12 as can be seen by the presence of the spacer layers 250 on top surfaces of the hardmasks 125. However, it is to be understood that substantially the same process steps as those described in connection with FIGS. 13-27 can also flow from FIG. 10.

Figure 13:
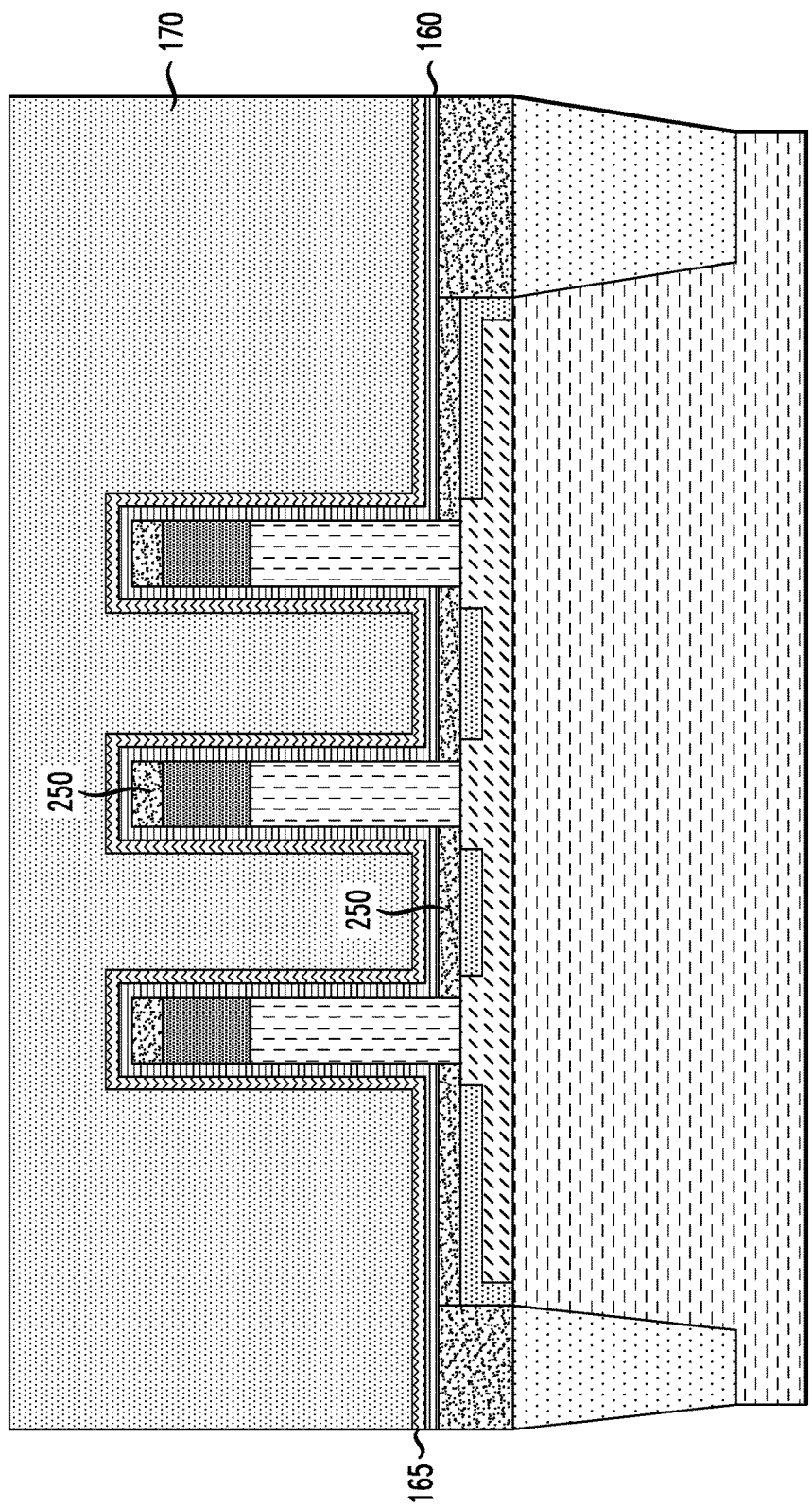
FIG. 13 is a cross-sectional view illustrating deposition of a gate structure in a method for manufacturing a semiconductor device, according to an exemplary embodiment of the present invention.

FIG. 13 is a cross-sectional view illustrating deposition of a gate structure in a method for manufacturing a semiconductor device, according to an exemplary embodiment of the present invention. As shown in FIG. 13, a high-K dielectric layer 160 including but not limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide) is deposited on the spacer layers 250 and on and around the stacked structures including the fins 120, hardmasks 125 and spacer layers 250. A work-function metal (WFM) layer 165, including but not limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, is deposited on the high-K dielectric layer 160, and a gate layer 170 including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof is deposited on the WFM layer 165. The gate structure including the high-K dielectric layer 160, WFM layer 165 and gate layer 170 may be formed using, for example, deposition techniques including, but not limited to, CVD, PECVD, RFCVD, PVD, ALD, MLD, MBD, PLD, and/or LSMCD, sputtering, and/or plating.

Figure 14:
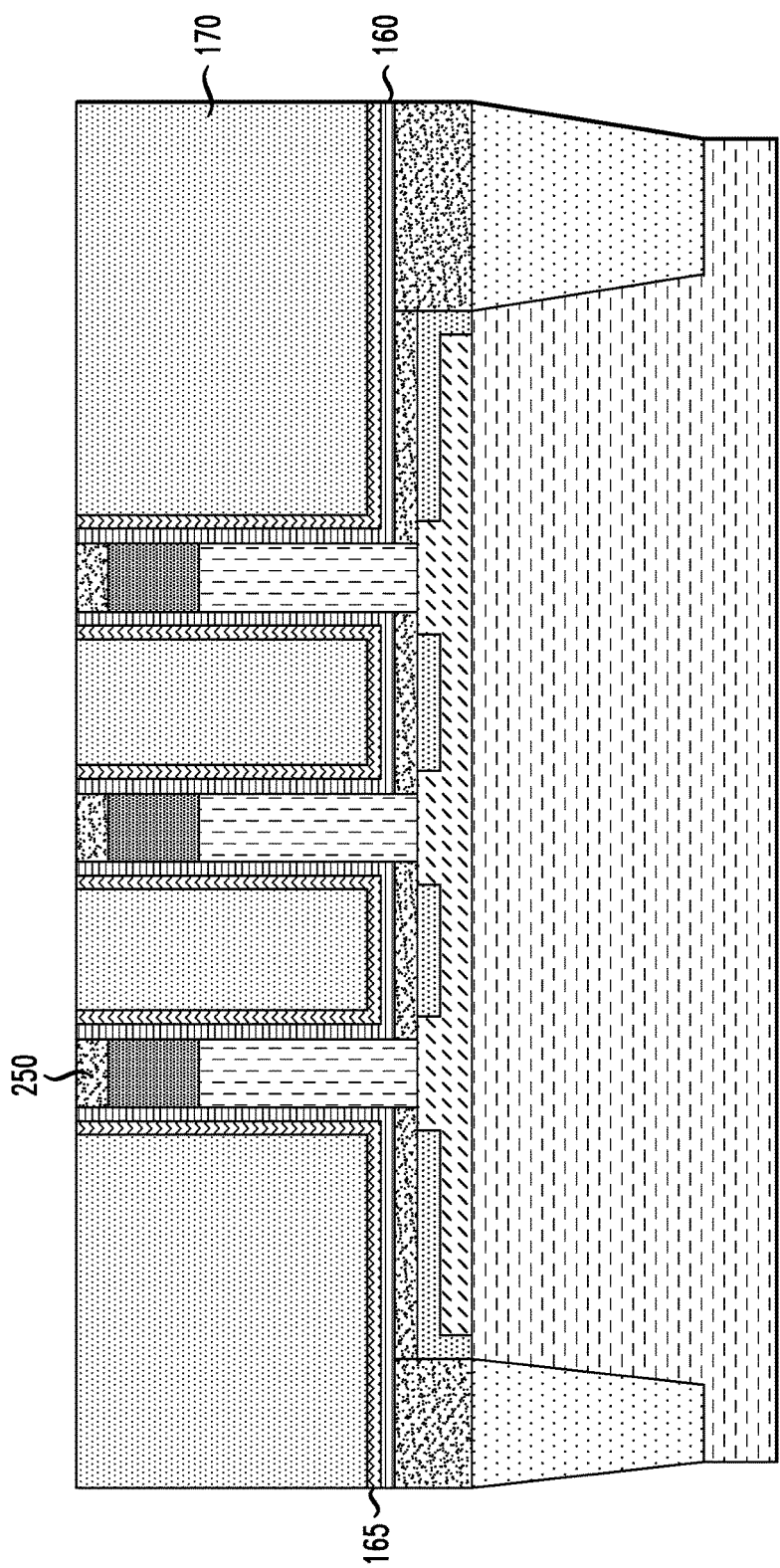
FIG. 14 is a cross-sectional view illustrating removal of part of the gate structure in a method for manufacturing a semiconductor device, according to an exemplary embodiment of the present invention.

FIG. 14 is a cross-sectional view illustrating removal of part of the gate structure in a method for manufacturing a semiconductor device, according to an exemplary embodiment of the present invention. As shown in FIG. 14, a planarization process, such as, for example, CMP, is performed to remove an upper portions of the high-K dielectric layer 160, WFM layer 165 and gate layer 170. FIG. 14 illustrates that the planarization is performed down to the spacer layers 250. Alternatively, the planarization can be performed down to the hardmasks 125, resulting in removal of the spacer layers 250.

Figure 15:
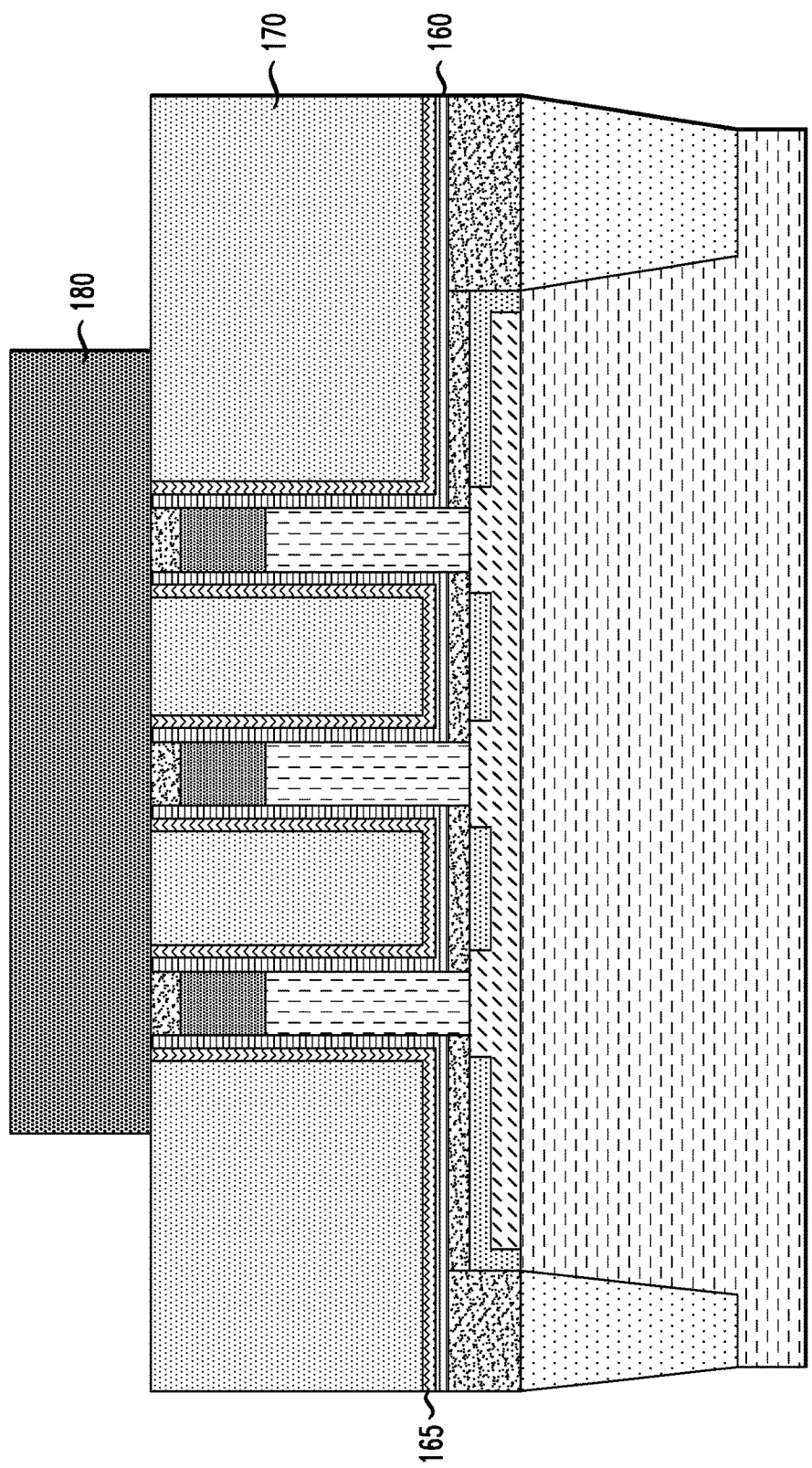
FIG. 15 is a cross-sectional view illustrating formation of a mask for gate structure patterning in a method for manufacturing a semiconductor device, according to an exemplary embodiment of the present invention.
Figure 16:
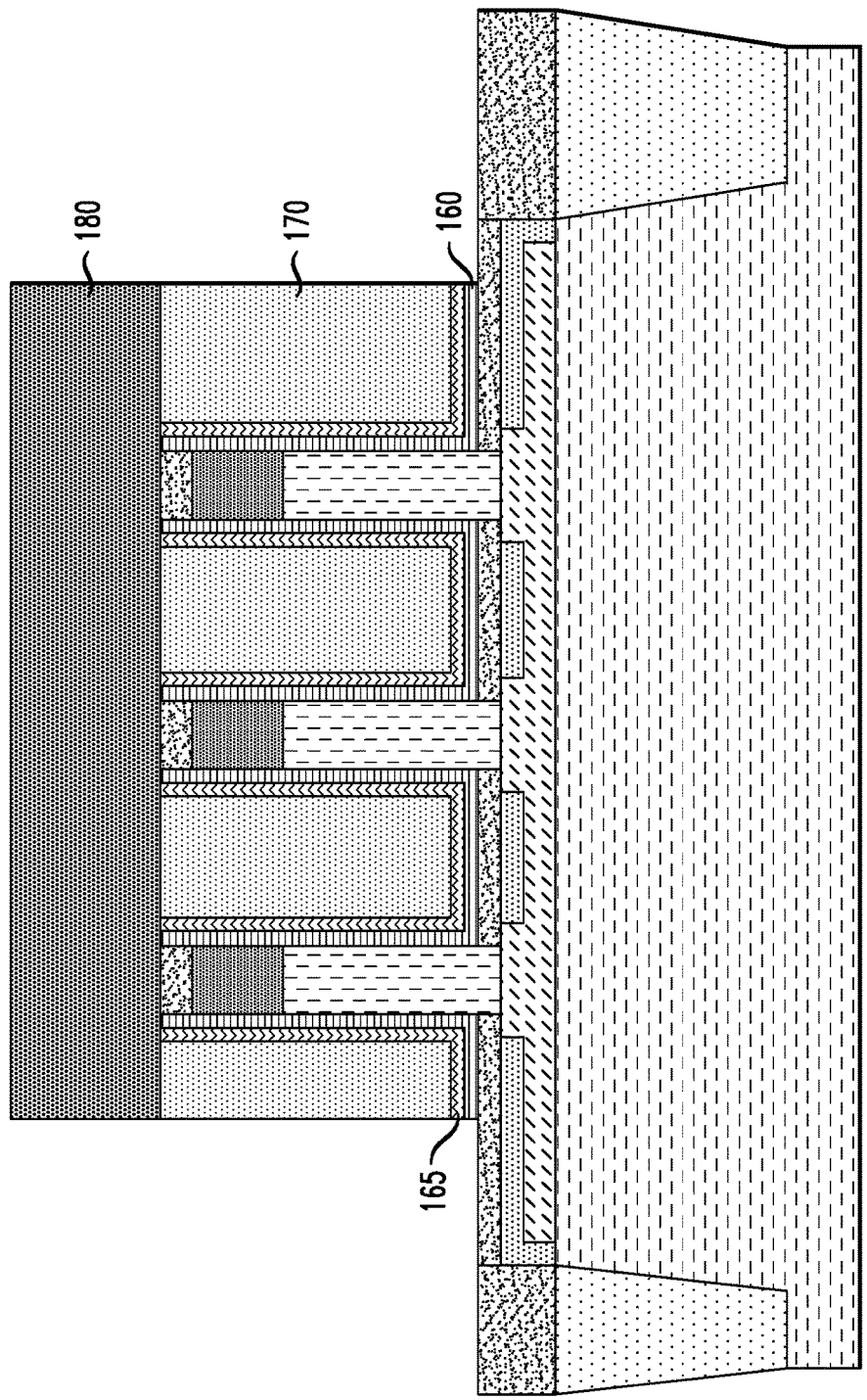
FIG. 16 is a cross-sectional view illustrating gate structure patterning in a method for manufacturing a semiconductor device, according to an exemplary embodiment of the present invention.

FIG. 15 is a cross-sectional view illustrating formation of a mask for gate structure patterning, and FIG. 16 is a cross-sectional view illustrating gate structure patterning in a method for manufacturing a semiconductor device, according to an exemplary embodiment of the present invention. As shown in FIGS. 15 and 16, a mask 180, such as, for example, a gate mask to pattern the gate is deposited on the planarized gate structure to cover portions of the gate structure that will remain after a removal process. The removal process can include, but is not limited to, a lithography process (e.g., optical or extreme ultraviolet (EUV) direct patterning or a spacer imaging transfer process). Using optical lithography as an example, an organic planarization layer (OPL), silicon-containing antireflection coating (SiARC) and photoresist are formed on the planarized gate structure, then after exposure and development, the photoresist will be formed into patterns. Then, the photoresist will be used as mask when etching the SiARC. After that, the patterned SiARC becomes a hard mask to pattern the OPL. Finally the patterned OPL is used as mask 180 when etching down the gate material. As a result, the lithography pattern is transferred to form the gate material. As shown in FIG. 16, the etching process, including but not limited to, fluorinated gases, such as carbon tetrafluoride ($CF_4$), sulfur hexafluoride ($SF_6$) or fluoroform ($CHF_3$), is then performed to remove those portions of the gate structure left exposed by the mask 180 where gates are not required.

Figure 17:
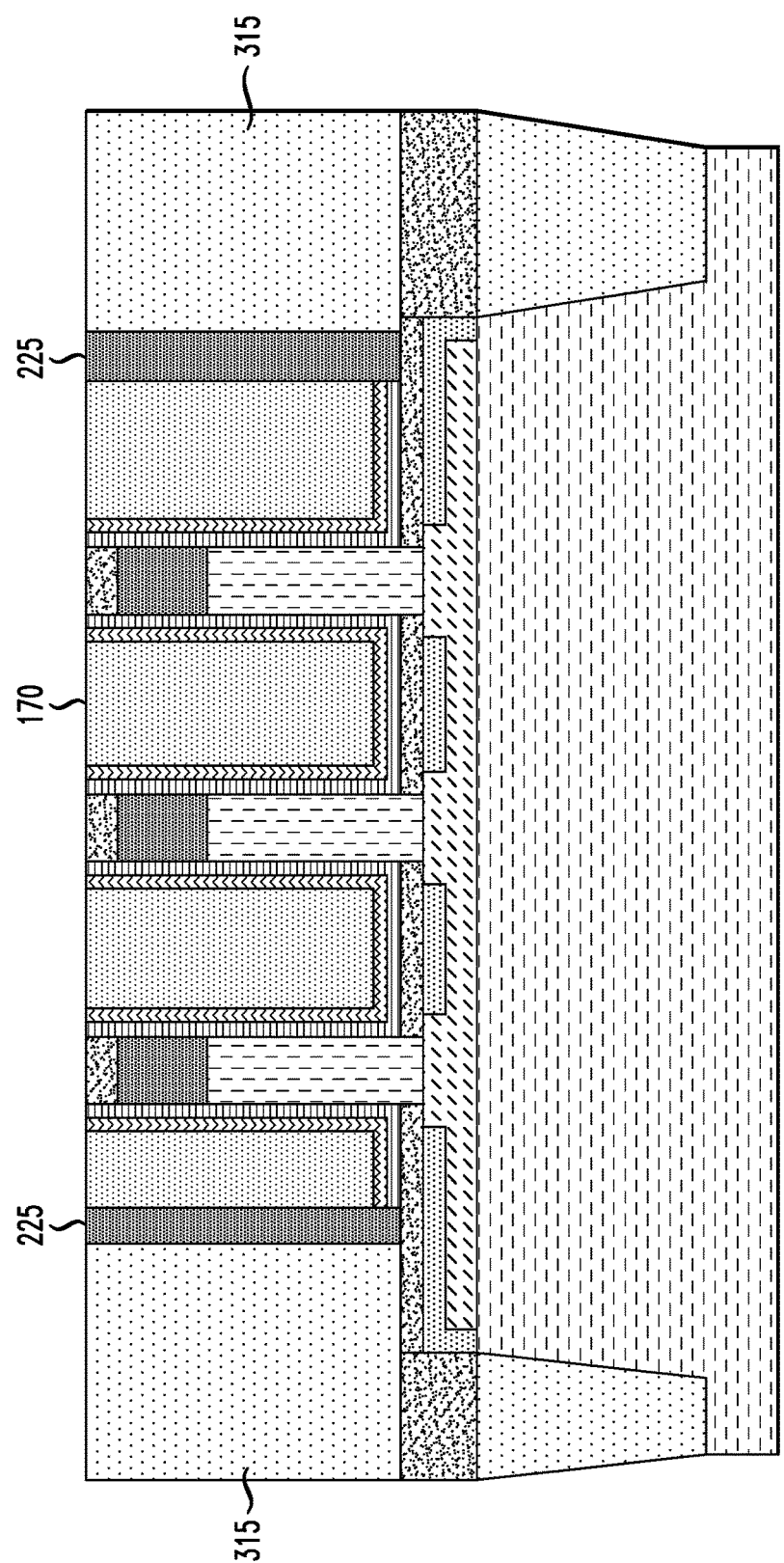
FIG. 17 is a cross-sectional view illustrating deposition of dielectric layers to encapsulate the remaining gate structure in a method for manufacturing a semiconductor device, according to an exemplary embodiment of the present invention.

FIG. 17 is a cross-sectional view illustrating deposition of dielectric layers to encapsulate the remaining gate structure in a method for manufacturing a semiconductor device, according to an exemplary embodiment of the present invention. As shown in FIG. 17, the mask 180 is stripped using, for example, using, for example, an $N_2$ or $O_2$ plasma ashing process or $H_4SO_4/H_2O_2/H_2O$ mixed solution. Dielectric layers 225 are deposited using, for example, ALD or MLD, on sides of the remaining gate structure, and on spacer layers 250. The dielectric layers 225 can include, but are not limited to, SiN, SiBCN or $SiO_2$.

In addition, a dielectric material, including, but not limited to $SiO_2$, LTO, HTO, FOX or some other dielectric, is deposited to form interlayer dielectric layers 315 adjacent the dielectric layers 225. The interlayer dielectric layers 315 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 225 and 315 and planarize the resulting structure.

Figure 18:
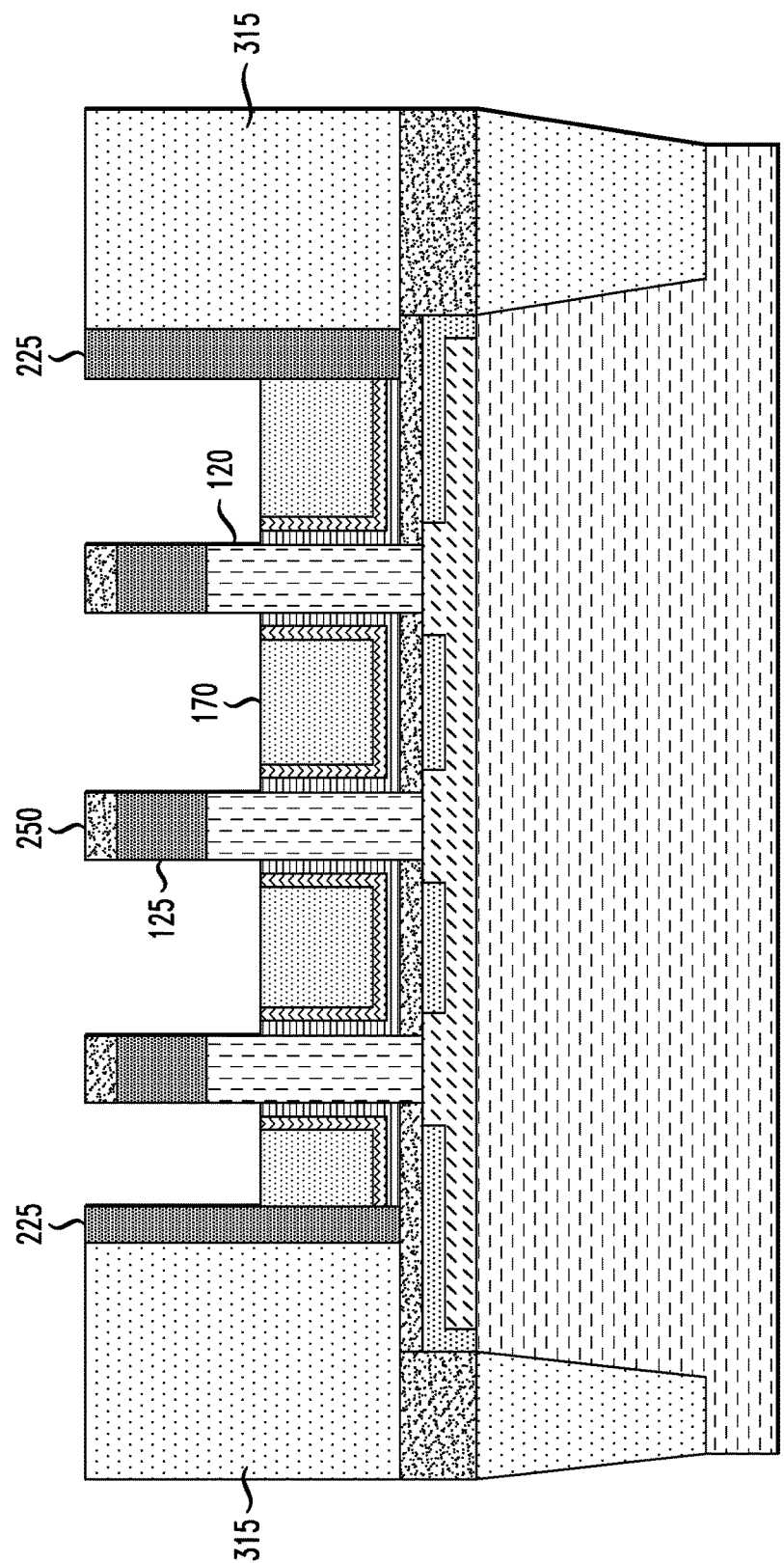
FIG. 18 is a cross-sectional view illustrating gate structure recessing in a method for manufacturing a semiconductor device, according to an exemplary embodiment of the present invention.

FIG. 18 is a cross-sectional view illustrating gate structure recessing in a method for manufacturing a semiconductor device, according to an exemplary embodiment of the present invention. As shown in FIG. 18, portions of the encapsulated gate structure between the dielectric layers 225, including the high-K dielectric layers 160, WFM layers 165 and gate layers 170, are removed using, for example, an anisotropic etch process, such as ME, ion beam etching, plasma etching or laser ablation. As can be seen, the layers 160, 165 and 170 are recessed to lower heights above the substrate 102.

Figure 19:
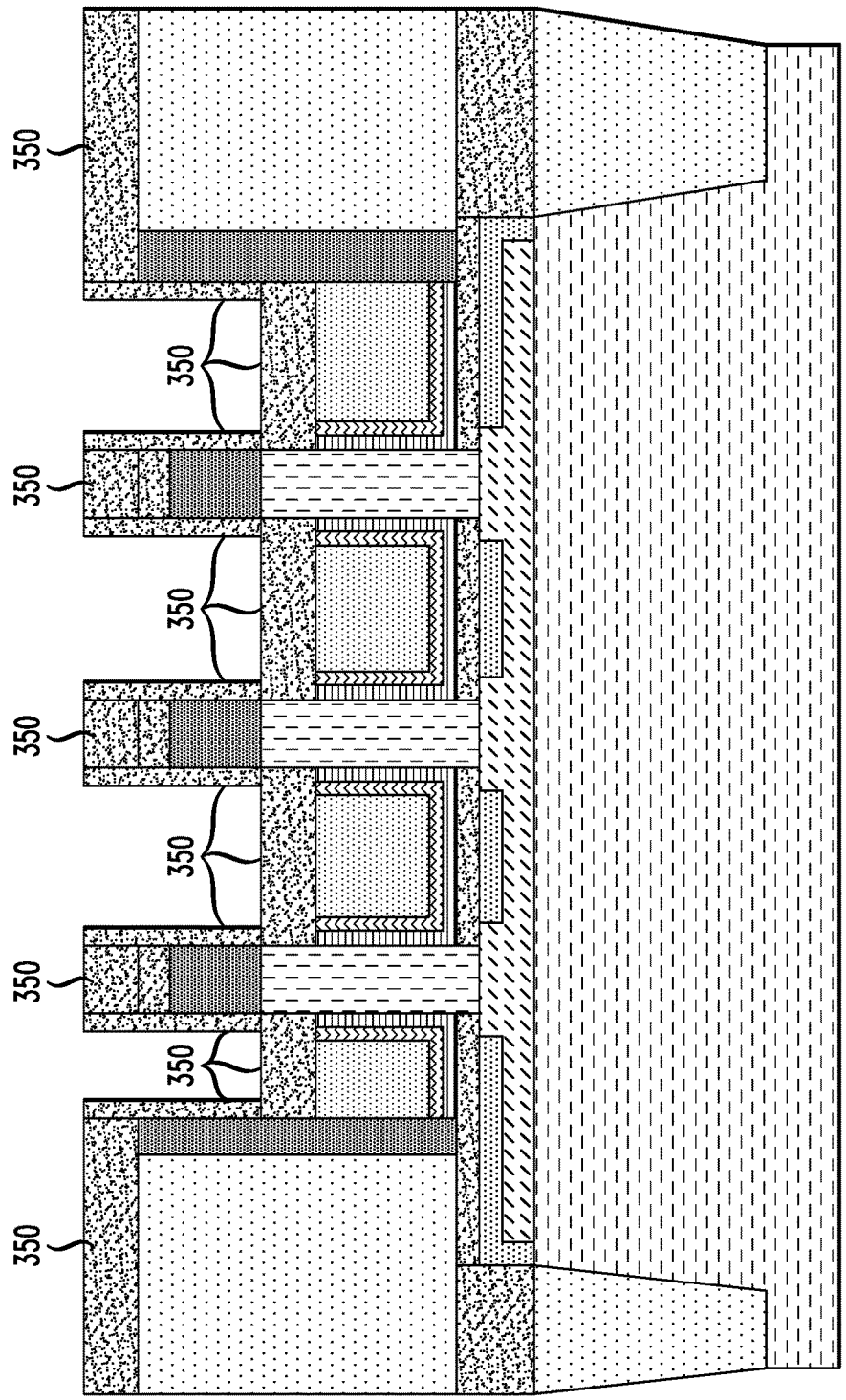
FIG. 19 is a cross-sectional view illustrating deposition of dielectric spacer layers in a method for manufacturing a semiconductor device, according to an exemplary embodiment of the present invention.

FIG. 19 is a cross-sectional view illustrating deposition of dielectric spacer layers in a method for manufacturing a semiconductor device, according to an exemplary embodiment of the present invention. As shown in FIG. 19, spacer dielectric layers 350, such as, for example a PECVD-type, HARP-type or HDP-type low-K dielectric layers, including, but not limited to, SiBCN, SiN or $SiO_2$ are deposited using, for example, PECVD, HARP or HDP techniques, on the recessed gate structures, dielectric layers 225 and 315, and on the stacked structures including the fins 120, hardmasks 125 and layer 250 (if layer 250 remained from the planarization step in FIG. 14). As can be seen in FIG. 19, the dielectric layers 350 are deposited to be thicker on horizontal portions (e.g., on the recessed gate structures, top surfaces of dielectric layers 225 and 315, and on top surfaces of the stacked structures) than on the vertical side portions of the stacked structures.

Figure 20:
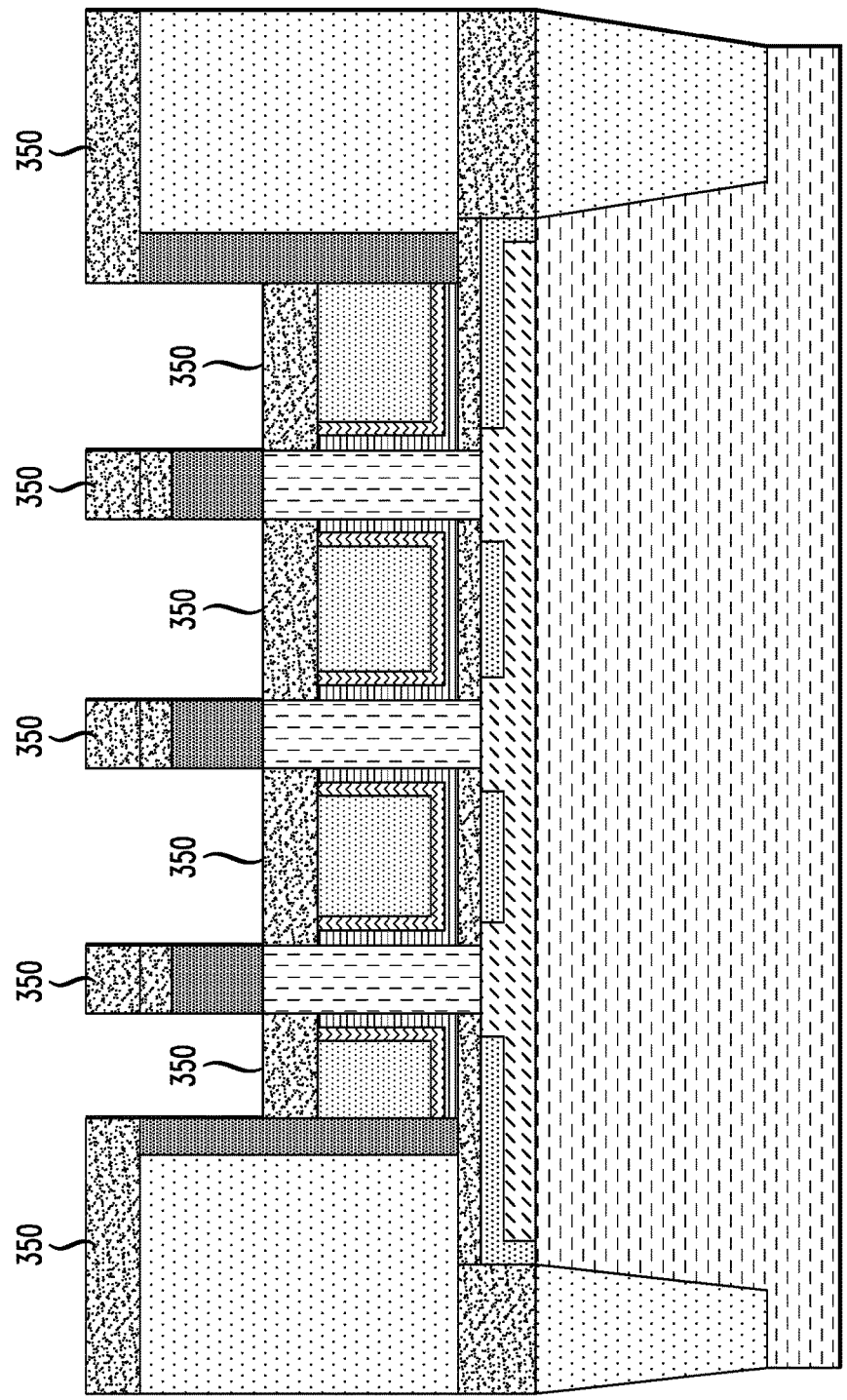
FIG. 20 is a cross-sectional view illustrating removal of portions of spacer dielectric layers in a method for manufacturing a semiconductor device, according to an exemplary embodiment of the present invention.

Then, referring to FIG. 20, an anisotropic etching process, such as ME, ion beam etching, plasma etching or laser ablation is performed to completely remove the dielectric layers 350 from the vertical side portions of the stacked structures, while leaving part or all of the dielectric layers on the horizontal portions.

Figure 21:
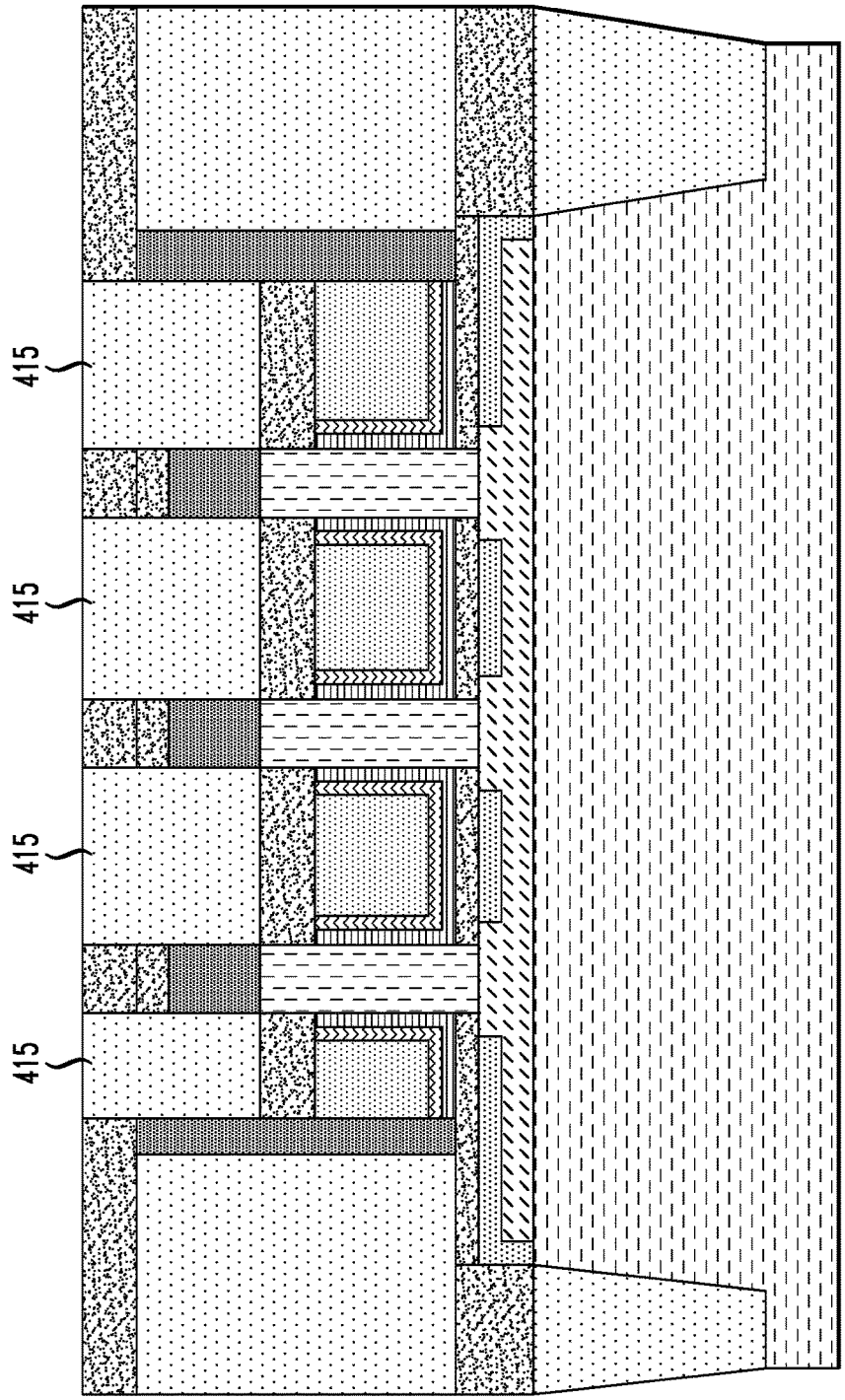
FIG. 21 is a cross-sectional view illustrating deposition of interlayer dielectric layers in a method for manufacturing a semiconductor device, according to an exemplary embodiment of the present invention.
Figure 22:
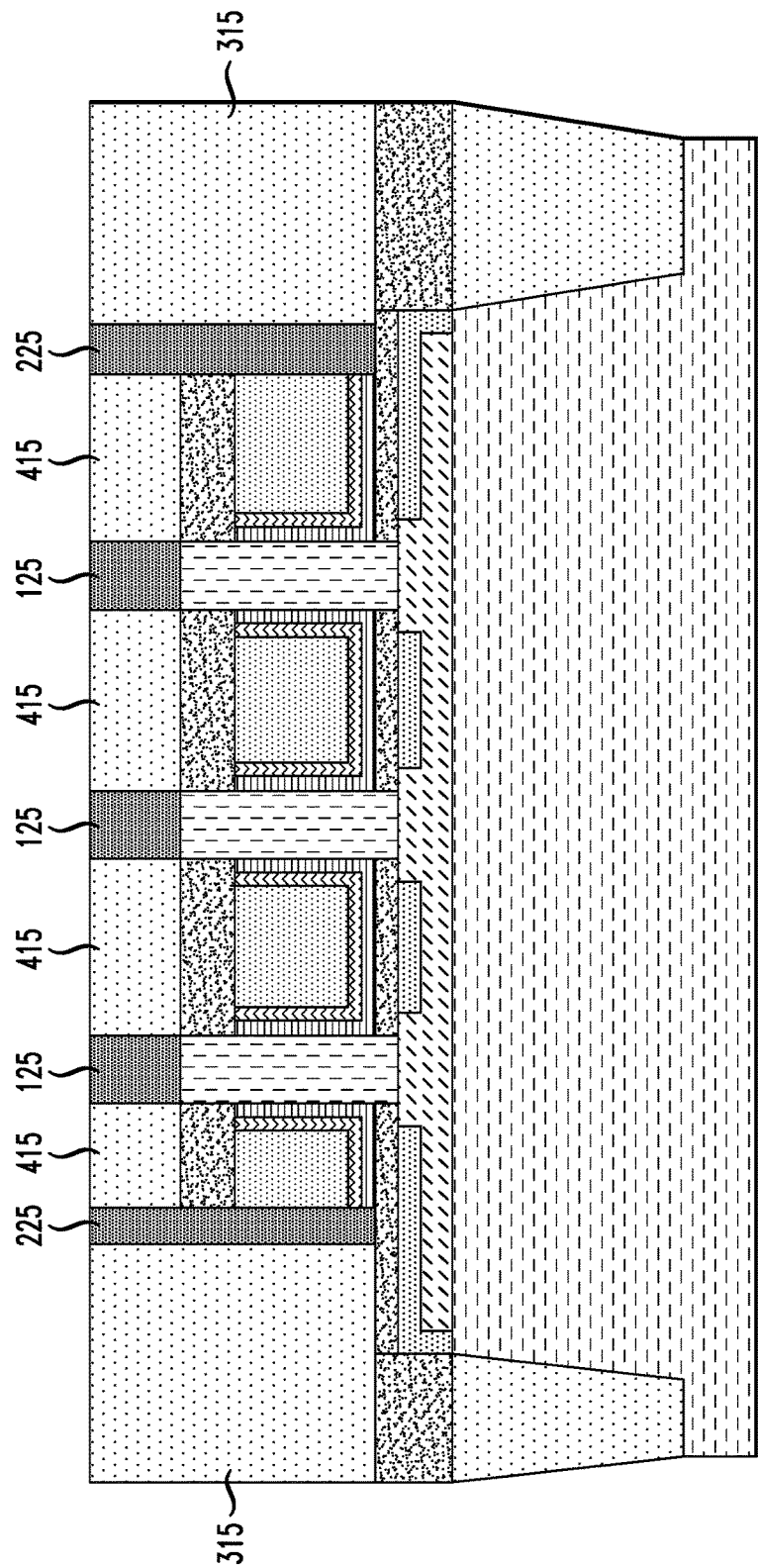
FIG. 22 is a cross-sectional view illustrating planarization of interlayer dielectric layers in a method for manufacturing a semiconductor device, according to an exemplary embodiment of the present invention.

FIG. 21 is a cross-sectional view illustrating deposition of interlayer dielectric layers in a method for manufacturing a semiconductor device, according to an exemplary embodiment of the present invention. As shown in FIG. 21, a dielectric material, including, but not limited to $SiO_2$, LTO, HTO, FOX or some other dielectric, is deposited to form interlayer dielectric layers 415 on the recessed gate structures, including the remaining horizontal portions of layer 350 on top surfaces of the recessed gate structures. The interlayer dielectric layers 415 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 415 and planarize the resulting structure. As shown in FIG. 22, the planarization can be performed down to the hardmasks 125 on the fins 120.

Figure 23:
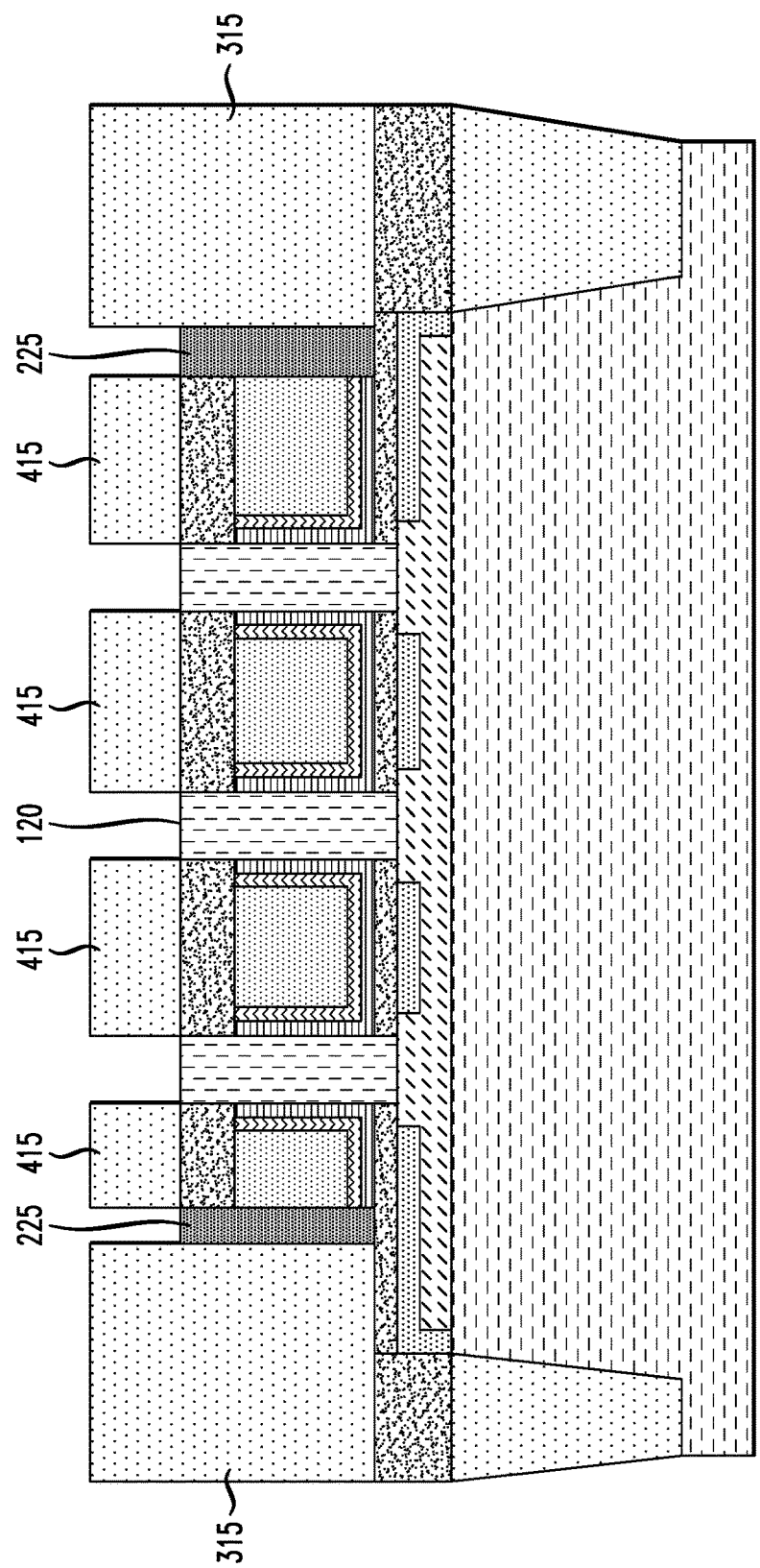
FIG. 23 is a cross-sectional view illustrating selective removal of the hardmask and portions of the dielectric layers in a method for manufacturing a semiconductor device, according to an exemplary embodiment of the present invention.
Figure 24:
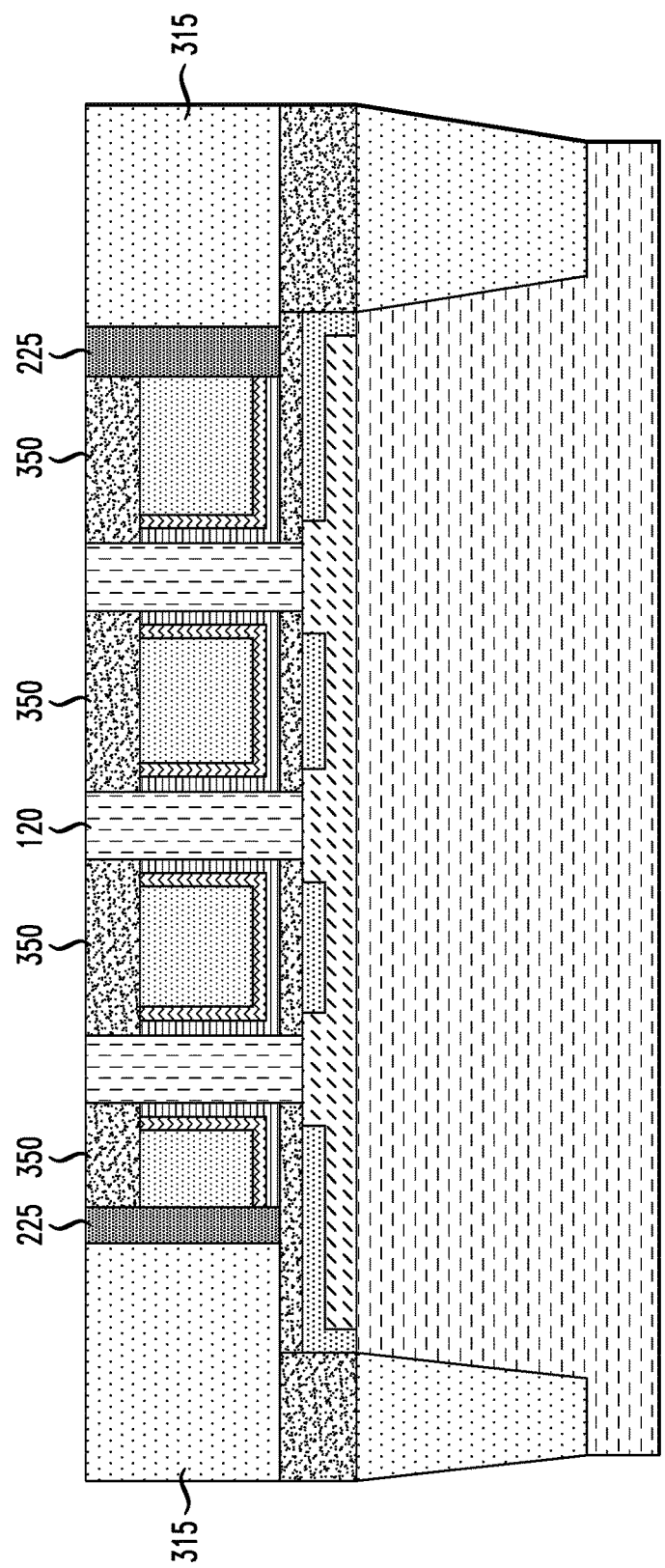
FIG. 24 is a cross-sectional view illustrating removal of portions of interlayer dielectric layers in a method for manufacturing a semiconductor device, according to an exemplary embodiment of the present invention.

FIG. 23 is a cross-sectional view illustrating selective removal of the hardmask and portions of the dielectric layers in a method for manufacturing a semiconductor device, according to an exemplary embodiment of the present invention. As shown in FIG. 23, the hardmask and portions of the dielectric layers 125, 225 are selectively removed, using for example, a selective etch process. The selective etch process can include, for example, fluorinated gas (such as $SF_6$, $CH_4$, or $CHF_3$) based dry etching or hot phosphoric acid ($H_3PO_4$) etching. According to an embodiment, the hardmask and dielectric layers 125, 225 include the same or similar material so that these layers 125, 225 can be selectively etched with respect to the other structures. As can be seen, the layers 125, 225 are etched until the hardmasks 125 are removed so that the remaining portions of the dielectric layers 225 each have a top surface that is level or substantially with a top surface of the fins 120. Then, as shown in FIG. 24, the portions of the interlayer dielectric layers 315, 415 protruding above the top surfaces of the dielectric layers 225 and the fins 120 are removed using, for example, another selective etching process, such as a selective oxide etch using, for example, $F/NH_3$ based dry etching. According to an embodiment, the interlayer dielectric layers 315, 415 include the same or similar material so that these layers 315, 415 can be selectively etched with respect to the other structures.

Figure 25:
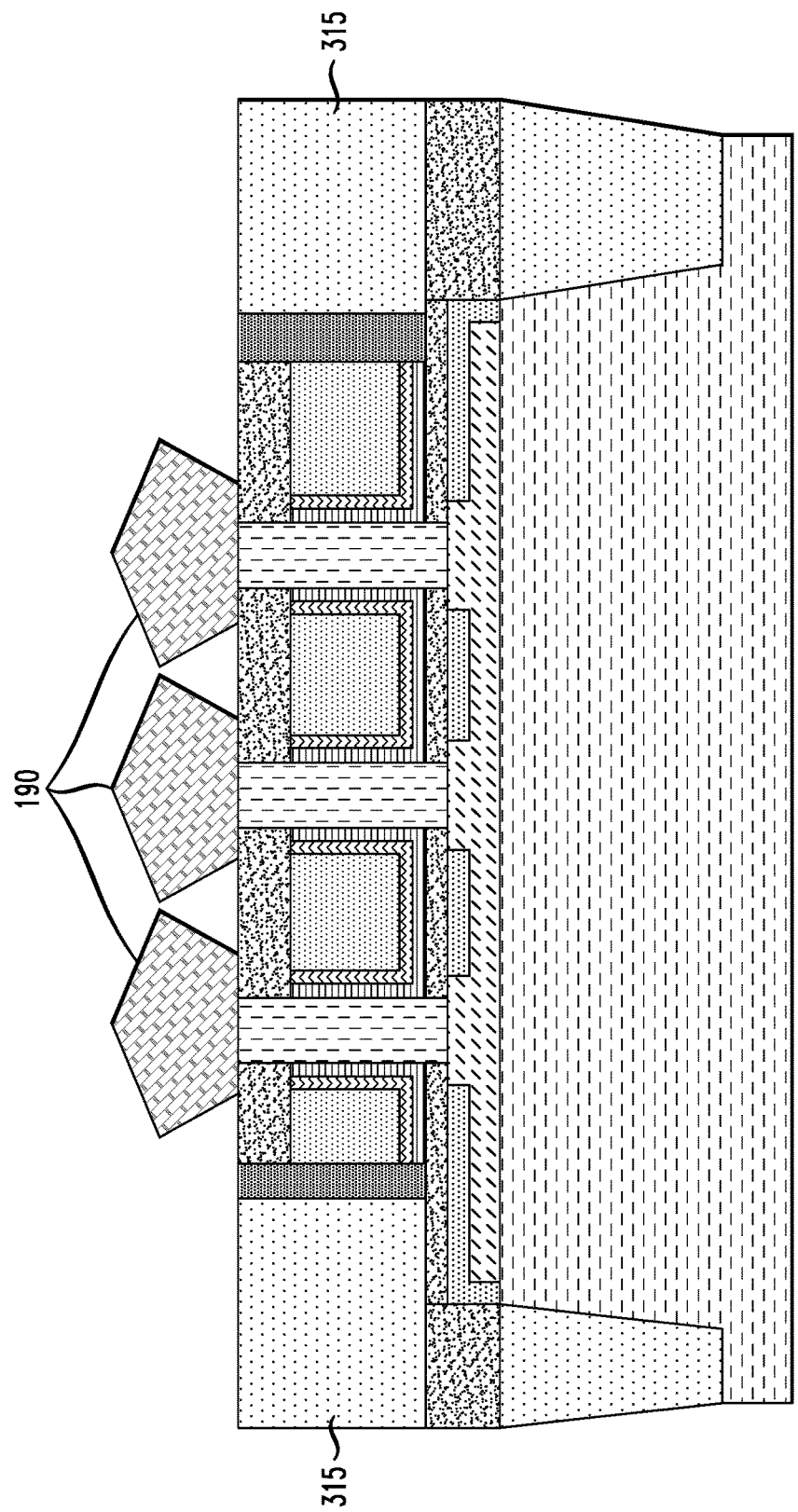
FIG. 25 is a cross-sectional view illustrating epitaxial growth of top source/drain regions in a method for manufacturing a semiconductor device, according to an exemplary embodiment of the present invention.

FIG. 25 is a cross-sectional view illustrating epitaxial growth of top source/drain regions in a method for manufacturing a semiconductor device, according to an exemplary embodiment of the present invention. As shown in FIG. 25, top source/drain regions 190 are epitaxially grown on the fins 120. Application of the sources for nFET and pFET epitaxial growth can be done by using block level patterning. For an nFET, As or P doped Si or SiC source/drain regions 190 are epitaxially grown. For a pFET, B doped SiGe or Si source/drain regions 190 are epitaxially grown. Doping can be at concentrations in the general range of e20/cm³. As can be seen in FIG. 25, epitaxial growth is stopped prior to merging so that the epitaxial regions 190 are not merged with each other. Alternatively, the epitaxial growth is not stopped prior to merging so that the epitaxial regions 190 are merged with each other. While the shape of the epitaxial source/drain regions 190 is illustrated as pentagonal, the embodiments of the present invention are not necessarily limited thereto, and other epitaxial shapes may be formed depending on orientations and materials used.

Figure 26:
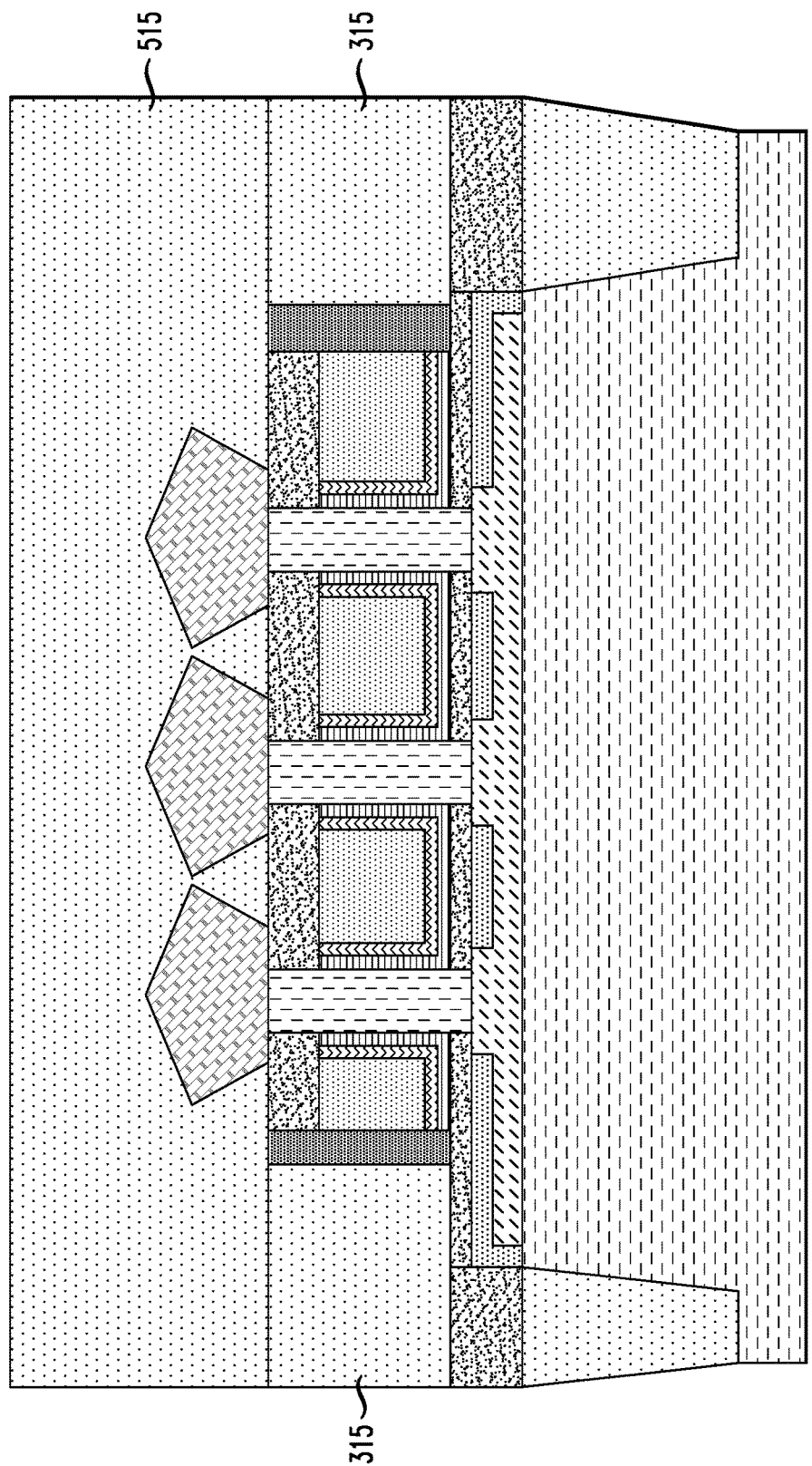
FIG. 26 is a cross-sectional view illustrating deposition of an interlayer dielectric layer in a method for manufacturing a semiconductor device, according to an exemplary embodiment of the present invention.

FIG. 26 is a cross-sectional view illustrating deposition of an interlayer dielectric layer in a method for manufacturing a semiconductor device, according to an exemplary embodiment of the present invention. As shown in FIG. 26, a dielectric material, including, but not limited to $SiO_2$, LTO, HTO, FOX or some other dielectric, is deposited on the structure from FIG. 25 on and around the top source/drain regions 190 to form interlayer dielectric layer 515. The interlayer dielectric layer 515 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess material from layers 515 and planarize the resulting structure.

Figure 27:
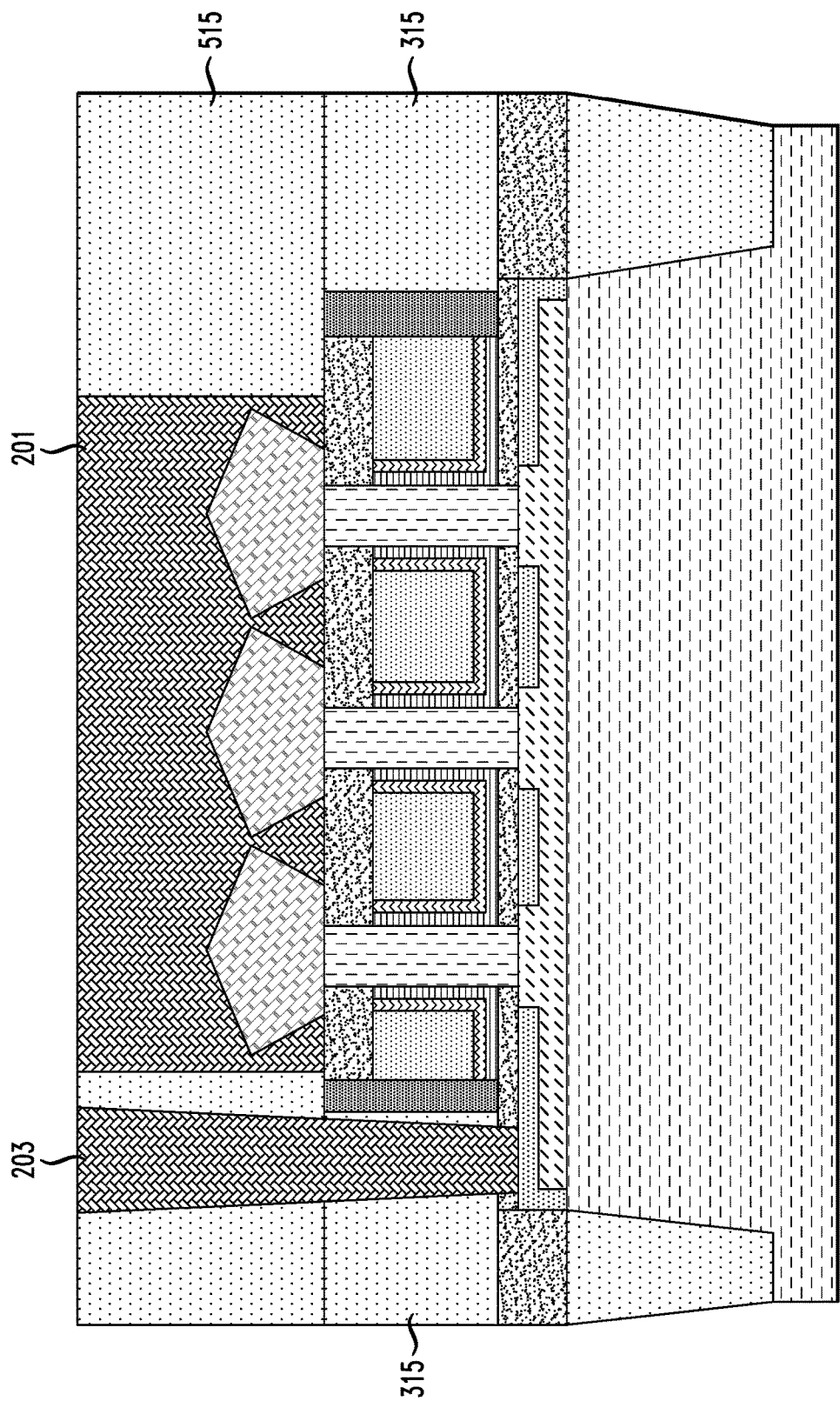
FIG. 27 is a cross-sectional view illustrating formation of contact regions in a method for manufacturing a semiconductor device, according to an exemplary embodiment of the present invention.

FIG. 27 is a cross-sectional view illustrating formation of contact regions in a method for manufacturing a semiconductor device, according to an exemplary embodiment of the present invention. As shown in FIG. 27, contact regions 201 and 203 (e.g., middle of the line (MOL) contact regions) are formed by etching vias in the interlayer dielectric layers 315 and/or 515, and filling the vias with an electrically conductive material. For example, contact region 201 is formed by etching a via in interlayer dielectric layer 515 and filling the via with a conductive metal. Similarly, contact region 203 is formed by etching a via through interlayer dielectric layers 315, 515 and spacer layer 250 down to the silicide layer 140, and filling the via with a conductive metal. As can be seen, the contact region 203 contacts the silicide layer 140 to provide electrical current to the bottom source/drain region 105.

The conductive metal can include, but is not limited to, tungsten, cobalt, ruthenium, copper, or combinations thereof, and may be deposited using, for example, deposition techniques including, but not limited to, CVD, PECVD, RFCVD, PVD, ALD, MLD, MBD, pulsed laser deposition, and/or LSMCD, sputtering, and/or plating. Planarization, for example, CMP can be performed to remove excess contact material after deposition and planarize the resulting structure.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A method for manufacturing a semiconductor device, comprising:
    forming a source/drain region on a semiconductor substrate;
    forming a semiconductor layer on the source/drain region;
    patterning the semiconductor layer into a plurality of fins extending from the source/drain region vertically with respect to the semiconductor substrate, wherein the source/drain region is located under bottom ends of the plurality of fins;

forming a silicide layer on exposed portions of the source/drain region;

forming an electrically conductive contact on the silicide layer; and forming a spacer layer on the silicide layer, wherein the electrically conductive contact extends through an opening in the spacer layer to contact the silicide layer;

wherein the semiconductor device comprises a vertical field-effect transistor (FET) device configured to carry current through the plurality of fins in a direction perpendicular to a top surface of the semiconductor substrate on which the source/drain region is formed and from which the plurality fins vertically extend.

2. The method according to claim 1, wherein the silicide layer wraps around an edge of the source/drain region.

3. The method according to claim 1, further comprising forming a protective layer on the plurality of fins prior to forming the silicide layer on the exposed portions of the source/drain region.

4. The method according to claim 1, further comprising:
removing a portion of the source/drain region and a portion of the substrate under the source/drain region to form a trench; and
filling the trench with a dielectric material to form an isolation region.

5. The method according to claim 4, further comprising recessing the isolation region to expose an edge of the source/drain region prior to forming the silicide layer on the exposed portions of the source/drain region.

6. The method according to claim 1, further comprising:
forming a gate structure on the spacer layer and on the plurality of fins; and
patterning the gate structure to remove a portion of the gate structure to expose a portion of the spacer layer where the opening through which the electrically conductive contact extends will be formed.

7. The method according to claim 6, further comprising recessing the gate structure between the plurality of fins.

8. The method according to claim 7, further comprising forming another spacer layer on the recessed gate structure.

9. The method according to claim 1, wherein the spacer layer comprises at least one of an oxide, silicon nitride (SiN), siliconborocarbonitride (SiBCN), and silicon oxycarbonitride (SiOCN).

10. The method according to claim 1, further comprising forming another source/drain region on top ends of each of the plurality of fins.

11. The method according to claim 10, forming a gate structure over the silicide layer and between the plurality of fins, wherein the gate structure is positioned under the other source/drain region.

12. A method for manufacturing a semiconductor device, comprising:
forming a first active region on a semiconductor substrate;
forming a semiconductor layer on the first active region;
patterning the semiconductor layer into a plurality of fins extending from the first active region vertically with respect to the semiconductor substrate, wherein the first active region is located under bottom ends of the plurality of fins;
forming a silicide layer on exposed portions of the first active region;
forming an electrically conductive contact on the silicide layer;
forming a second active region on top ends of each of the plurality of fins;
forming a gate structure between the plurality of fins, wherein the gate structure is positioned over the first active region and under the second active region; and
forming a spacer layer on the silicide layer, wherein the electrically conductive contact extends through an opening in the spacer layer to contact the silicide layer;
wherein the semiconductor device comprises a vertical field-effect transistor (FET) device configured to carry current through the plurality of fins in a direction perpendicular to a top surface of the semiconductor substrate on which the first active region is formed and from which the plurality fins vertically extend.

13. The method according to claim 12, wherein the silicide layer wraps around an edge of the first active region.

14. The method according to claim 12, further comprising forming a protective layer on the plurality of fins prior to forming the silicide layer on the exposed portions of the first active region.

15. The method according to claim 12, further comprising:
removing a portion of the first active region and a portion of the substrate under the first active region to form a trench; and
filling the trench with a dielectric material to form an isolation region.

16. The method according to claim 15, further comprising recessing the isolation region to expose an edge of the first active region prior to forming the silicide layer on the exposed portions of the first active region.

17. The method according to claim 12, wherein the gate structure is formed on the spacer layer, and the method further comprises patterning the gate structure to remove a portion of the gate structure to expose a portion of the spacer layer where the opening through which the electrically conductive contact extends will be formed.

18. The method according to claim 17, further comprising recessing the gate structure between the plurality of fins.

* * * * *